United States Patent
Forbes et al.

(10) Patent No.: US 6,309,907 B1
(45) Date of Patent: *Oct. 30, 2001

(54) METHOD OF FABRICATING TRANSISTOR WITH SILICON OXYCARBIDE GATE

(75) Inventors: Leonard Forbes, Corvallis, OR (US); Joseph E. Geusic, Berkeley Heights, NJ (US); Kie Y. Ahn, Chappaqua, NY (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/138,294

(22) Filed: Aug. 21, 1998

Related U.S. Application Data

(62) Division of application No. 08/902,132, filed on Jul. 29, 1997, now Pat. No. 5,886,368.

(51) Int. Cl.[7] ................................................... H01L 21/00
(52) U.S. Cl. ............................. 438/105; 438/59; 438/264
(58) Field of Search ................................. 438/59, 82, 105, 438/257, 264

(56) References Cited

U.S. PATENT DOCUMENTS 4,113,515   9/1978   Kooi et al. ........................... 148/1.5

(List continued on next page.)

FOREIGN PATENT DOCUMENTS 0681333   8/1995   (EP) .

| | | |
|---|---|---|
| 3-222367 | 10/1991 | (JP) . |
| 6-224431 | 8/1994 | (JP) . |
| 6-302828 | 10/1994 | (JP) . |
| 07-226507 | 8/1995 | (JP) . |
| 8-255878-TR | 10/1996 | (JP) . |
| 8-255878 | 10/1996 | (JP) . |

OTHER PUBLICATIONS

Zirinsky, S., et al., "Electrical Resistivity of Amorphous Silicon Resistor Films", *Extended Abstracts of the Spring Meeting of the Electrochemical Society,* Washington, DC,pp. 147–149, (1971).

(List continued on next page.)

*Primary Examiner*—Chandra Chaudhari
(74) *Attorney, Agent, or Firm*—Schwegman, Lundberg, Woessner & Kluth, P.A.

(57) ABSTRACT

A CMOS-compatible FET has a reduced electron affinity polycrystalline or microcrystalline silicon oxycarbide (SiOC) gate that is electrically isolated (floating) or interconnected. The SiOC material composition is selected to establish a desired barrier energy between the SiOC gate and a gate insulator. In a memory application, such as a flash EEPROM, the SiOC composition is selected to establish a lower barrier energy to reduce write and erase voltages and times or accommodate the particular data charge retention time needed for the particular application. In a light detector or imaging application, the SiOC composition is selected to provide sensitivity to the desired wavelength of light. Unlike conventional photodetectors, light is absorbed in the floating gate, thereby ejecting previously stored electrons therefrom. Also unlike conventional photodetectors, the light detector according to the present invention is actually more sensitive to lower energy photons as the semiconductor bandgap is increased.

62 Claims, 11 Drawing Sheets

U.S. PATENT DOCUMENTS

| | | | |
|---|---|---|---|
| 4,460,670 | 7/1984 | Ogawa et al. | 430/57 |
| 4,507,673 | 3/1985 | Aoyama et al. | 357/23 R |
| 4,657,699 | 4/1987 | Nair | 252/513 |
| 4,738,729 | 4/1988 | Yoshida et al. | 136/258 |
| 4,769,686 | 9/1988 | Horiuchi et al. | 357/23.8 |
| 4,849,797 | 7/1989 | Ukai et al. | 357/237 |
| 4,893,273 | 1/1990 | Usami | 365/185 |
| 5,049,950 | 9/1991 | Fujii et al. | 357/2 |
| 5,111,430 | 5/1992 | Morie | 365/185 |
| 5,145,741 | 9/1992 | Quick | 428/402 |
| 5,235,195 * | 8/1993 | Tran et al. | 438/59 |
| 5,260,593 | 11/1993 | Lee | 257/316 |
| 5,293,560 | 3/1994 | Harari | 365/185 |
| 5,317,535 | 5/1994 | Talreja et al. | 365/185 |
| 5,369,040 | 11/1994 | Halvis et al. | 437/3 |
| 5,388,069 | 2/1995 | Kokubo | 365/185 |
| 5,415,126 | 5/1995 | Loboda et al. | 117/88 |
| 5,424,993 | 6/1995 | Lee et al. | 365/218 |
| 5,438,544 | 8/1995 | Makino | 365/185 |
| 5,449,941 | 9/1995 | Yamazaki et al. | 257/411 |
| 5,465,249 | 11/1995 | Cooper et al. | 365/149 |
| 5,467,306 | 11/1995 | Kaya et al. | 365/185.2 |
| 5,477,485 | 12/1995 | Bergemont et al. | 365/185.24 |
| 5,493,140 | 2/1996 | Iguchi | 257/316 |
| 5,508,543 | 4/1996 | Hartstein et al. | 257/314 |
| 5,530,581 | 6/1996 | Cogan | 359/265 |
| 5,562,769 | 10/1996 | Dreifus et al. | 117/86 |
| 5,580,380 | 12/1996 | Liu et al. | 117/86 |
| 5,604,357 | 2/1997 | Hori | 257/24 |
| 5,629,222 | 5/1997 | Yamazaki et al. | 438/259 |
| 5,670,790 | 9/1997 | Katoh et al. | 257/14 |
| 5,714,766 | 2/1998 | Chen et al. | 257/20 |
| 5,740,104 | 4/1998 | Forbes | 365/185.03 |
| 5,754,477 | 5/1998 | Forbes | 365/185.33 |
| 5,801,401 | 9/1998 | Forbes | 257/77 |
| 5,858,811 | 1/1999 | Tohyama, S | 438/75 |
| 5,877,041 * | 3/1999 | Fuller et al. | 438/105 |
| 5,886,368 | 3/1999 | Forbes et al. | 257/77 |
| 5,886,379 | 3/1999 | Jeong | 257/319 |
| 5,907,775 | 5/1999 | Tseng | 438/261 |
| 5,912,837 | 6/1999 | Lakhani | 365/185.02 |
| 6,163,066 | 12/2000 | Forbes et al. | 257/632 |

OTHER PUBLICATIONS

Akasaki, I., et al., "Effects of AlN Buffer Layer on Crystallographic Structure and on Electrical and Optical Properties of GaN and Ga(1–x)Al(x)N [0<x (< or =) 0.4] Films Grown on Sapphire Substrate by MOVPE", *J. Crystal Growth*, 98, 209–219, (1989).

Alok, D., et al., "Electrical Properties of Thermal Oxide Grown on N–type 6H–Silicon Carbide", *Applied Physcis Letters*, 64, 2845–2846, (May 23, 1994).

Andrieux, M., et al., "Interface and Adhesion of PACVD SiC Based Films on Metals", *Supp. Le Vide: science, technique et applications*, 279, 212–214, (1996).

Bachmann, P., et al., "Influence on Surface Modifications on the Electronic Properties of CVD Diamond Films", *Diamond and Related Materials*, 5, 1378–1383, (1996).

Baglee, D., "Characteristics & Reliability of 100 Angstrom Oxides", *IEEE 22nd Annual Proc.: Reliability Physics*, Las Vegas, 152–155, (Apr. 3–5, 1984).

Beheim, G., et al., "Magnetron Plasma Etching of SiC for Microstructures", *Proc: SPIE—Integrated Optics and Microstructures III*, San Jose, CA, 82–86, (Jan. 29, 1996).

Bengtsson, S., et al., "Applications of Aluminum Nitride Films Deposited by Reactive Sputtering on Silicon–On–Insulator Materials", *Japanese J. Applied Physics*, 35, 4175–4181, (1996).

Benjamin, M., et al., "UV Photoemission Study of Heteroepitaxial AlGaN Films Grown on 6H–SiC", *Applied Surface Science*, 104/105, 455–460, (1996).

Bermudez, V., et al., "The Growth and Properties of Al and AlN Films on GaN(0001)–(1×1)", *J. Applied Physics*, 79, 110–119, (Jan. 1996).

Boeringer, D.W., et al., "Avalanche amplificaiton of multiple resonant tunneling through parallel silicon microcrystallites", *Physical Rev. B*, 51, 13337–13343, (1995).

Casey, H., et al., "Low Interface Trap Density for Remote Plasma Deposited $SiO_2$ on n–type GaN", *Applied Phys. Lett.*, 68, 1850–1852, (Mar. 1996).

Chang, C., et al., "Novel Passivation Dielectrics—The Boron– or Phosphorus–Doped Hydrogenated Amorphous Silicon Carbide Films", *Journal of the Electrochemical Society*, 132, 418–422, (Feb. 1985).

Choi, J., et al., "Effect of Deposition Conditions and Pretreatments on the Microstructure of MPECVD Diamond Thin Films", *Materials Chemistry and Physics*, 45, 176–179, (1996).

Clarke, G., et al., "The Infrared Properties of Magnetron–Sputtered Diamond–Like Thin Films", *Thin Solid Films*, 280, 130–135, (1996).

Compagnini, G., et al., "Spectroscopic Characterization of Annealed Si(1–x)C(x) Films", *J. Materials Res.*, 11, 2269–2273, (Sep. 1996).

Dartnell, N., et al., "Reactive Ion Etching of Silicon Carbide (Si(x)C(1–x))", *Vacuum*, 46, 349–355, (1995).

Demichelis, F., et al., "Influence of Doping on the Structural and Optoelectronic Properties of Amorphous and Microcrystalline Silicon Carbide", *Journal of Applied Physics*, 72, 1327–1333, (Aug. 15, 1992).

Demichelis, F., et al., "Physical Properties of Undoped and Doped Microcrystalline SiC:H Deposited By PECVD", *Materials Research Society Symposium Proceedings*, 219, Anaheim, CA, 413–418, (Apr. 30–May 3, 1991).

Dipert, B., et al., "Flash Memory Goes Mainstream", *IEEE Spectrum*, 30, 48–52, (1993).

Edelberg, E., et al., "Visible Luminescence from Nanocrystalline silicon films produced by plasma enhanced chemical vapor deposition", *Appl. Phys. Lett.*, 68, 1415–1417, (1996).

Fissel, A., et al., "Epitaxial Growth of SiC Thin Films on Si–stabilized alpha–SiC (0001) at Low Temperatures by Solid–source Molecular Beam Epitaxy", *Journal of Crystal Growth*, 154, 72–80, (1995).

Friedrichs, P., et al., "Interface Properties of Metal–Oxide–Semiconductor Structures on N–Type 6H and 4H–SiC", *J. Applied Physics*, 79, 7814–7819, (May 15, 1996).

Fujii, T., et al., "Bonding Structures in Highly Photoconductive a–SiC:H Films Deposited by Hybrid–Plasma Chemical Vapor Deposition", *Journal of Non–Crystalline Solids*, 198–200, 577–581, (1996).

Goetzberger, A., et al., *Applied Solid State Science: Advances in Materials and Device Research*, R. Wolfe, ed., Academic Press, New York, Including p. 233, (1969).

Graul, J., et al., "Growth Mechanism of Polycrystalline beta–SiC Layers on Silicon Substrate", *Applied Phys. Lett.*, 21, 67–69, (Jul. 1972).

Hamakawa, Y., et al., "Optoelectronics and Photovoltaic Applications of Microcrystalline SiC", *Materials Research Society Symposium Proceedings*, 164, Boston, MA, 291–301, (Nov. 29–Dec. 1, 1989).

He, Z., et al., "Ion–beam–assisted Deposition of Si–carbide Films", *Thin Solid Films*, 260, 32–37, (1995).

Hu, G., "Will Flash Memory Replace Hard Disk Drive?", *IEEE Electron Devices Meeting*, Session 24, (Dec. 13, 1994).

Hwang, J., et al., "High Mobility beta–SiC Epilayer Prepared by Low–pressure Rapid Thermal Chemical Vapor Deposition on a (100) Silicon Substrate", *Thin Solid Films*, 272, 4–6, (1996).

Hybertsen, M.S., "Absorption and Emission of Light in Nanoscale Silicon Structures", *Phys. Rev. Lett.*, 72, 1514–1517, (1994).

Jou, S., et al., "Electron Emission Characterization of Diamond Thin Films Grown from a Solid Carbon Source", *Thin Solid Films*, 280, 256–261, (1996).

Kato, M., et al., "Read–Disturb Degradation Mechanism due to Electron Trapping in the Tunnel Oxide for Low–voltage Flash Memories", *IEEE Electron Device Meeting*, 45–48, (1994).

Kothandaraman, M., et al., "Reactive Ion Etching of Trenches in 6H–SiC", *J. Electronic Materials*, 25, 875–878, (1996).

Kumbhar, A., et al., "Growth of Clean Amorphous Silicon–Carbon Alloy Films by Hot–Filament Assisted Chemical Vapor Deposition Technique", *Applied Phys. Lett*, 66, 1741–1743, (Apr. 1995).

Lakshmi, E., et al., "Interface–State Characteristics of GaN/ GaAs MIS Capacitors", *Solid–State Electronics*, 25, 811–815, (1982).

Lanois, F., et al., "Angle Etch Control for Silicon Carbide Power Devices", *Applied Phys. Lett.*, 69, 236–238, (Jul. 1996).

Lau, S., et al., "Optoelectronic Properties of Highly Conductive Microcrystalline SiC Produced by Laser Crystallization of Amorphous SiC", *J. of Non–Crystalline Solids*, 198–200, 907–910, (1996).

Leggieri, G., et al., "Laser Ablation Deposition of Silicon Carbide Films", *Applied Surface Science*, 96–98, 866–869, (1996).

Lei, T., et al., "Epitaxial Growth and Characterization of Zinc–Blende Gallium Nitride on (001) Silicon", *J. Appl. Phys.*, 71, 4933–4943, (May 1992).

Liu, J., et al., "Formation of SiC Films on Silicon Field Emitters", *Materials Res. Soc. Symp. Proc.*, 311, San Francisco, CA, (Apr. 13–15, 1993).

Liu, J., et al., "Modification of Si Field Emitter Surfaces by Chemical Conversion to SiC", *J. Vac. Sci. Technology*, B 12, 717–721, (1994).

Luo, J., et al., "Localized Epitaxial Growth of Hexagonal and Cubic SiC Films on Si by Vacuum Annealing", *Applied Phys. Lett.*, 69, 916–918, (Aug. 1996).

Martins, R., et al., "Transport Properties of Doped Silicon Oxycarbide Microcrystalline Films Produced by Spatial Separation Techniques", *Solar Energy Materials and Solar Cells*, 41–42, 493–517, (1996).

Martins, R., et al., "Wide Band Gap Microcrystalline Silicon Thin Films", *Diffusion and Defect Data : Solid State Phenomena*, 44–46, Part 1, Scitec Publications, 299–346, (1995).

Maury, F., et al., "Chemical Vapor Co–Deposition of C and SiC at Moderate Temperature for the Synthesis of Compositionally Modulated Si(x)C(1–x) Ceramic Layers", *Surface and Coatings Technology*, 76–77, 119–125, (1995).

McLane, G., et al., "High Etch Rates of SiC in Magnetron Enhanced SF(6) Plasmas", *Applied Phys. Lett.*, 68, 3755–3757, (Jun. 1996).

Mogab, C., et al., "Conversion of Si to Epitaxial SiC by Reaction with C(2)H(2)", *J. Applied Physics*, 45, 1075–1084, (Mar. 1974).

Molnar, R., et al., "Growth of Gallium Nitride by Electron––Cyclotron Resonance Plasma–Assisted Molecular–Beam Epitaxy: The Role of Charged Species", *J. Appl. Phys.*, 76, 4587–4595, (1994).

Muller, K., et al., "Trench Storage Node Technology for Gigabit DRAM Generations", *Digest IEEE Int. Electron Devices Meeting*, San Francisco, CA, 594–597, (Dec. 1996).

Nemanich, P., et al., "Diamond Negative Electron Affinity Surfaces, Structures and Devices", *Proc. : Third International Conference on Applications of Diamond Films and Related Materials*, 1, Gaithersburg, MD, 17–24, (1995).

Nemanich, R., et al., "Negative Electron Affinity Surfaces of Aluminum Nitride and Diamond", *Diamond and Related Materials*, 5, 790–796, (1996).

Ouyang, M., et al., "Deposition of Diamond–Like Carbon Films via Excimer Laser Ablation of Polybutadiene", *Materials Science and Engineering*, B39, 228–231, (1996).

Pankove, J., "Photoelectric Emission", In: *Optical Processes in Semiconductors*, Dover Publications Inc., New York, 287–301, (1971).

Pankove, J., et al., "Photoemission from GaN", *Applied Phys. Lett.*, 25, 53–55, (1974).

Papadas, C., et al., "Modeling of the Intrinsic Retention Charcteristics of FLOTOX EEPROM Cells Under Elevated Temperature Conditions", *IEEE Transaction on Electron Devices*, 42, 678–682, (Apr. 1995).

Patuwathavithane, C., et al., "Oxidation Studies for 6H–SiC", *Proc: 4th Int. Conf. on Amorphous and Crystalline Silicon Carbide IV*, Santa Clara, CA, 163–169, (Oct. 9–11, 1991).

Pereyra, I., et al., "Wide Gap a–Si(1–x)C(x): H Thin Films Obtained Under Starving Plasma Deposition Conditions", *J. Non–Crystalline Solids*, 201, 110–118, (1996).

Pollack, S., "Electron Transport Through Insulating Thin Films", *Appl. Solid–State Science*, 1, 345–355, (1969).

Prendergast, J., "Flash or DRAM: Memory Choice for the Future", *IEEE Electron Device Meeting, Session 25*, Phoenix, AZ, (1995).

Rahman, M., et al., "Preparation and Electrical Properties of An Amorphous SiC/ Crystalline Si p(+)n Heterostructure", *Japanese J. Applied Physics*, 23, 515–524, (May 1984).

Renlund, G., et al., "Silicon Oxycarbide Glasses: Part I. Preparation and Chemistry", *Journal of Materials Research*, 6, 2716–2722, (Dec. 1991).

Renlund, G., et al., "Silicon Oxycarbide Glasses: Part II. Structure and Properties", *Journal of Materials Research*, 6, 2723–2734, (Dec. 1991).

Schmidt, I., et al., "Low Temperature Diamond Growth Using Fluorinated Hydrocarbons", *Diamond and Related Materials*, 5, 1318–1322, (1996).

Schoenfeld, O., et al., "Formation of Si Quantum dots in Nanocrystalline silicon", *Proc. 7th Int. Conf. on Modulated Semiconductor Structures*, Madrid, 605–608, (1995).

Serre, C., et al., "Ion–Beam Synthesis of Amorphous SiC Films: Structural Analysis and Recrystallization", *J. Appl. Phys.,* 79, 6907–6913, (May 1996).

Sim, S., et al., "A New Planar Stacked Technology (PST) for Scaled and Embedded DRAMs", *Digest IEEE Int. Electron Devices Meeting,* San Francisco, CA, 504–507, (Dec. 1996).

Suzaki, Y., et al., "Quantum Size Effects of a–Si(:H)/ a–SiC(:H) Multilayer Films Prepared by rf Sputtering", *Abstracts of Papers Published in the Int. J. Japanese Soc. for Precision Engineering,* 28, Abstract of Paper in vol. 60, 182, (Jun. 1994).

Svirkova, N., et al., "Deposition Conditions and Density- –of–States Spectrum of a–Si(1–x)C(x) :H Films Obtained by Sputtering", *Semiconductors,* 28, 1164–1169, (Dec. 1994).

Sze, S., *Physics of Semiconductors,* 2nd Edition., John Wiley & Sons, Pub., New York, ISBN 0471056618, (1981).

Tarui, Y., "Flash Memory Features Simple Structure, Superior Integration", *JEE,* 30, 84–87, (Sep. 1993).

Tenhover, M., et al., "DC–Magnetron Sputtered Silicon Carbide", *Materials Res. Soc. Symp. Proc.,* 356, Boston, MA, 227–232, (Nov. 28–Dec. 2, 1994).

Thomas, J., et al., "Plasma Etching and Surface Analysis of a–SiC :H Films Deposited by Low Temperature Plasma Enhanced Chemical Vapor Deposition", *Materials Res. Soc. Symp. Proc.,* 334, Boston, MA, 445–450, (Nov. 29–Dec. 2, 1993).

Tiwari, S., et al., "A silicon nanocrystal based memory", *Appl. Physics Lett.,* 68, 1377–1379, (1996).

Tiwari, S., et al., "Volatile and Non–Volatile Memories in Silicon with Nano–Crystal Storage", *Int'l Electron Devices Meeting: Technical Digest,* Washington, DC, 521–524, (Dec. 1995).

Tsu, R., et al., "Slow Conductance oscillations in nanoscale silicon clusters of quantum dots", *Appl. Phys. Lett.,* 65, 842–844, (1994).

Tsu, R., et al., "Tunneling in Nanoscale Silicon Particles Embedded in an SiO/sub/2 Matrix", *Abstract, IEEE Device Research Conference,* 178–179, (1996).

Tucker, C., et al., "Ion–beam–assisted Deposition of Non-hydrogenated a–Si:C Films", *Can. J. Physics,* 74, 97–101, (1996).

van der Weide, J., et al., "Negative–electron–affinity Effects on the Diamond (100) Surface", *Physical Review B [Condensed Matter],* 50, 5803–5806, (Aug. 15, 1994).

Vodakov, Y., et al., "Diffusion and Solubility of Impurities in Silicon Carbide", In: *Silicon Carbide,* R.C. Marshall, et al., eds., Univ. of South Carolina Press, 508–519, (1973).

Wahab, Q., et al., "3C–SiC / Si / 3C–SiC Epitaxial Trilayer Films Deposited on Si (111) Substrates by Reactive Magnetron Sputtering", *J. Materials Res.,* 10, 1349–1351, (Jun. 1995).

Watanabe, A., et al., "SiC Thin Film Preparation by ArF Excimer Laser Chemical Vapor Deposition. Part 1: Rate of Photolysis of Alkylsilanes by ArF Excimer Laser and their Decomposition Products", *Thin Solid Films,* 274, 70–75, (1996).

Wolter, S., et al., "Textured Growth of Diamond on Silicon via in situ Carburization and Bias–Enhanced Nucleation", *Appl. Phys. Lett.,* 62, 1215–1217, (Mar. 1993).

Wu, K., et al., "The Growth and Characterization of Silicon/ Silicon Carbide Heteroepitaxial Films on Silicon Substrates by Rapid Thermal Chemical Vapor Deposition", *Japanese J. Appl. Phys.,* 35, 3836–3840, (1996).

Yamaguchi, Y., et al., "Properties of Heteroepitaxial 3C–SiC Films Grown by LPCVD", *Digest of Tech. Papers: 8th Int. Conf. on Solid–State Sensors and Actuators and Eurosensors IX,* vol. 2, Stockholm, Sweden, 190–193, (Jun. 1995).

Yamanashi, H., et al., "Deposition of Silicon Compound Thin Films in DC Discharge Plasma Using Hydrogen–Hexamethyldisilane Gas Mixture", *Proc.: Int. Symp. on Surfaces and Thin Films of Electronic Materials. Bull. of the Res. Institute of Electronics,* Shizuoka University, 30, 95–98, (1995).

Ye, Q., et al., "Resonant Tunneling via Microcrystalline– silicon quantum confinement", *Physical Rev. B,* 44, 1806–1811, (1991).

Yee, A., et al., "The Effect of Nitrogen on Pulsed Laser Deposition of Amorphous Silicon Carbide Films: Properties and Structure", *J. Materials Research,* 11, 1979–1986, (1996).

Yoder, M., "Wide Bandgap Semiconductor Materials and Devices", *IEEE Transactions on Electron Devices,* 43, 1633–1636, (Oct. 1996).

Zhao, X., et al., "Nanocrystalline Si: a material constructed by Si quantum dots", 1st Int. Conf. on Low Dimensional Structures and Devices, Singapore, 467–471, (1995).

Sakata, I., et al., "Amorphous silicon/amorphous silicon carbide heterojunctions applied to memory device structures", *Electronics Letters,* 30(9), pp. 688–689, (Apr. 1994).

\* cited by examiner

METHOD OF FABRICATING TRANSISTOR WITH SILICON OXYCARBIDE GATE

This application is a divisional of U.S. Ser. No. 08/902,132 now U.S. Pat. No. 5,886,368, filed Jul. 29, 1997.

FIELD OF THE INVENTION

The present invention relates generally to integrated circuit technology, and particularly to a silicon oxycarbide gate transistor, such as a floating gate transistor, and complementary metal-oxide-semiconductor (CMOS) compatible methods of fabrication, and methods of use in memory and imaging devices.

BACKGROUND OF THE INVENTION

Field-effect transistors (FETs) are typically produced using a standard complementary metal-oxide-semiconductor (CMOS) integrated circuit fabrication process. Such a process allows a high degree of integration for obtaining a high circuit density with relatively few processing steps. Resulting FETs typically have gate electrodes composed of n-type conductively doped polycrystalline silicon (polysilicon).

The intrinsic properties of the polysilicon gate material affects operating characteristics of the FET. Silicon (monocrystalline and polycrystalline) has intrinsic properties that include a relatively small energy bandgap ($E_g$), e.g. approximately 1.2 eV, and a corresponding electron affinity ($\chi$) that is relatively large, e.g. $\chi \approx 4.2$ eV. For example, for p-channel FETs fabricated by a typical CMOS process, these and other material properties result in a large turn-on threshold voltage ($V_T$) magnitude. As a result, the $V_T$ magnitude must be downwardly adjusted by doping the channel region that underlies the gate electrode of the FET.

Another drawback with polysilicon gate FETs arises during use as a nonvolatile memory device, such as in electrically erasable and programmable read only memories (EEPROMs). EEPROM memory cells typically use FETs having an electrically isolated (floating) gate that affects conduction between source and drain regions of the FET. A gate dielectric is interposed between the floating gate and an underlying channel region between source and drain regions. A control gate is provided adjacent to the floating gate, separated therefrom by an intergate dielectric.

In such memory cells, data is represented by charge stored on the polysilicon floating gates. Fowler-Nordheim tunneling is one method that is used to store charge on the polysilicon floating gates during a write operation and to remove charge from the polysilicon floating gate during an erase operation. However, the relatively large electron affinity of the polysilicon floating gate presents a relatively large tunneling barrier energy at its interface with the underlying gate dielectric. The large tunneling barrier energy provides longer data retention times than realistically needed. For example, a data charge retention time at 85° C. is estimated to be in millions of years for some floating gate memory devices. The large tunneling barrier energy also increases the time needed to store charge on the polysilicon floating gates during the write operation and the time needed to remove charge from the polysilicon floating gate during the erase operation. This is particularly problematic for "flash" EEPROMs, which have an architecture that allows the simultaneous erasure of many floating gate transistor memory cells. Since more charge must be removed from the many floating gates in a flash EEPROM, even longer erasure times are needed to accomplish this simultaneous erasure. There is a need in the art to obtain floating gate transistors allowing faster storage and erasure, such as millisecond erasure periods for flash EEPROMs.

Other problems result from the large erasure voltages that are typically applied to a control gate of the floating gate transistor in order to remove charge from the floating gate. These loge erasure voltages are a consequence of the large tunneling barrier energy between the polysilicon floating gate and the underlying gate dielectric. The large erasure voltages can result in hole injection into the gate dielectric. This can cause erratic overerasure, damage to the gate dielectric, and introduction of trapping states in the gate dielectric. The high electric fields that result from the large erasure voltages can also result in reliability problems, leading to device failure. There is a need in the art to obtain floating gate transistors that allow the use of lower erasure voltages.

Halvis et al. (U.S. Pat. No. 5,369,040) discloses a charge-coupled device (CCD) photodetector which has transparent gate MOS imaging transistors fabricated from polysilicon with the addition of up to 50% carbon, and preferably about 10% carbon, which makes the gate material more transparent to the visible portion of the energy spectrum. The Halvis et al. patent is one example of a class of conventional CCD photodetectors that are directed to improving gate transmissivity to allow a greater portion of incident light in the visible spectrum to penetrate through the gate for absorption in the semiconductor substrate. However, the absorption of photons in the semiconductor substrate is limited to high energy photons exceeding a bandgap energy of the semiconductor substrate. There is a need in the art to detect lower energy photons independently of the semiconductor bandgap energy limitation. For the reasons stated above, and for other reasons stated below which will become apparent to those skilled in the art upon reading and understanding the present specification, the above described needs are unresolved in the art of fabrication of imaging devices, FETs, and EEPROMs using CMOS processes.

SUMMARY OF THE INVENTION

The present invention includes a transistor having a silicon oxycarbide (SiOC) gate. The transistor includes a source region, a drain region, and a channel region between the source and drain regions. A gate is separated from the channel region by an insulator. The gate is formed of a silicon oxycarbide compound $SiO_{(2-2w)}C_w$. The SiOC composition w is selected approximately between 0 and 1.0, such as to establish a desired value of a barrier energy between the gate and the insulator. In one embodiment, the gate is an electrically isolated floating gate and the transistor includes a control gate, separated from the floating gate by an intergate dielectric.

In another embodiment, the present invention includes an imaging device that is capable of detecting low energy photons independent of a semiconductor bandgap energy. The imaging device includes a source region, a drain region, and a channel region between the source and drain regions. A floating gate is separated from the channel region by an insulator. The floating gate is formed of a silicon oxycarbide compound $SiO_{(2-2w)}C_w$. The SiOC composition w is selected approximately between 0 and 1.0, such as to establish a desired value of a barrier energy between the gate and the insulator. The floating gate is adapted for emission of charge from the floating gate in response to absorbed incident photons.

In another embodiment, the present invention includes a memory device that is capable of providing short programming and erase times, low programming and erase voltages, and lower electric fields in the memory cell for improved reliability. The memory device includes a plurality of memory cells, each providing a transistor. Each transistor includes a source region, a drain region, and a channel region between the source and drain regions. A floating gate is separated from the channel region by an insulator. The floating gate is formed of a silicon oxycarbide compound $SiO_{(2-2w)}C_w$. The SiOC composition w is selected at a value approximately between 0 and 1.0, such as to establish a desired value of a barrier energy between the gate and the insulator. A control gate is located adjacent to the floating gate and separated therefrom by an interlayer dielectric.

In another embodiment, the present invention includes a method of producing a SiOC gate transistor on a semiconductor substrate. Source and drain regions are formed, thereby defining a channel region between the source and drain regions. An insulating layer is formed on the channel region. A gate is formed on the insulating layer. The gate comprises a silicon oxycarbide compound $SiO_{(2-2w)}C_w$. The SiOC composition w is selected at a value approximately between 0 and 1.0. In one embodiment, the method also includes forming a second insulating layer on the floating gate and forming a control gate on the second insulating layer.

In another embodiment, the present invention includes a method of using a transistor having a floating gate formed of a silicon oxycarbide compound $SiO_{(2-2w)}C_w$, such as for data storage. The SiOC composition w is selected at a value approximately between 0 and 1.0, such as to establish a desired value of a barrier energy between the floating gate and an insulator. Data is stored as charge on the floating gate. Data is read by detecting a conductance between source and drain regions of the transistor, wherein the conductance varies based on the stored data charge on the floating gate. Data is erased by removing charge from the floating gate.

In another embodiment, the present invention includes an method using a transistor having a floating gate formed of a silicon oxycarbide compound $SiO_{(2-2w)}C_w$, such as for light detection of low energy photons. The SiOC composition w is selected at a value approximately between 0 and 1.0, such as to establish a desired wavelength of incident light absorption to which the floating gate is sensitive. Charge is stored on the floating gate. Incident light is received at the floating gate, thereby removing at least a portion of the stored charge from the floating gate by the photoelectric effect. A change in conductance between the transistor source and drain is detected. According to one aspect of the invention, low energy photons are detected independently of a semiconductor substrate bandgap energy.

Thus, the present invention includes a CMOS-compatible FET having a low electron affinity SiOC gate that is either electrically isolated (floating) or interconnected. According to one aspect of the present invention, the SiOC composition w can be selected to provide the desired barrier energy at the SiOC—$SiO_2$ interface, such as 0<w<0.4, or 0.5<w<1.0.

In one embodiment of the present invention that is particularly useful in a flash EEPROM application, the SiOC composition w is selected to provide the desired programming and erase voltage and time or data charge retention time. The lower barrier energy and increased tunneling probability of the SiOC gate advantageously provides faster programming and erasure times for floating SiOC gate transistors in flash EEPROM memories. This is particularly advantageous for "flash" EEPROMs in which many floating gate transistor memory cells must be erased simultaneously. Writing and erasure voltages are also advantageously reduced, minimizing the need for complicated and noisy on-chip charge pump circuits to generate the large erasure voltage. Lower erasure voltages also reduce hole injection into the gate dielectric that can cause erratic overerasure, damage to the gate dielectric, and introduction of trapping states in the gate dielectric. Reducing the erasure voltage also lowers electric fields in the memory cell, minimizing reliability problems that can lead to device failure, and better accommodating downward scaling of device dimensions.

In another embodiment of the present invention, the SiOC composition w is selected to decrease the data charge retention time to a desired value. Since conventional data charge retention times are longer than what is realistically needed, a shorter data charge retention time can be tolerated in order to obtain the benefits of a smaller barrier energy. The data charge retention time can be selected between seconds and millions of years by selecting the value of the SiOC composition w, such as to obtain different memory functionality.

In another embodiment of the present invention that is particularly useful for an imaging application, the SiOC composition w is selected to provide sensitivity to the desired wavelength of light. Unlike conventional photodetectors, light is absorbed in the floating gate, thereby ejecting previously stored electrons therefrom. Also unlike conventional photodetectors, the light detector according to the present invention is actually more sensitive to lower energy photons as the semiconductor bandgap is increased.

BRIEF DESCRIPTION OF THE DRAWINGS

In the drawings, like numerals describe substantially similar components throughout the several views.

DETAILED DESCRIPTION OF THE INVENTION

Figure 1:
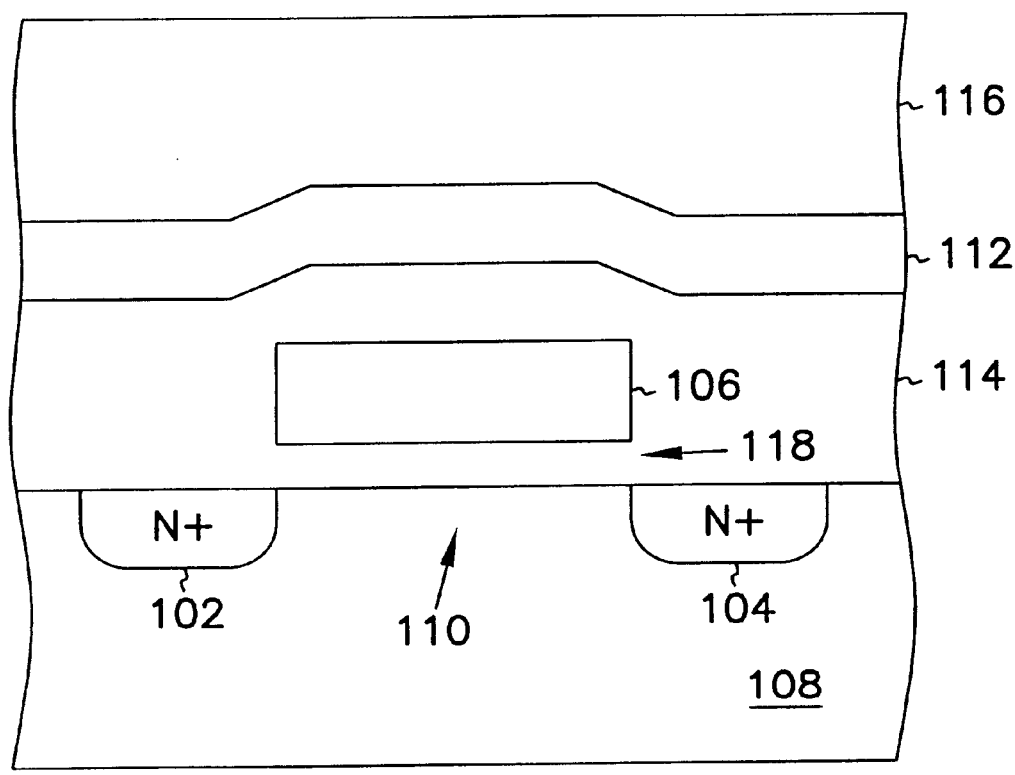
FIG. 1 is a cross-sectional schematic diagram illustrating generally one embodiment of a FET provided by the invention, which includes an electrically isolated (floating) or interconnected gate including a silicon oxycarbide (SiOC) compound.

In the following detailed description of the preferred embodiment, reference is made to the accompanying drawings which form a part hereof, and in which is shown, by way of illustration, a specific embodiment in which the invention may be practiced. In the drawings, like numerals describe substantially similar components throughout the several views. This embodiment is described in sufficient detail to enable those skilled in the art to practice the invention. Other embodiments may be utilized and structural and electrical changes may be made without departing from the scope of the present invention. The terms wafer and substrate used in the following description include any semiconductor-based structure having an exposed surface with which to form the integrated circuit structure of the invention. Wafer and substrate are used interchangeably to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined only by the appended claims.

The present invention discloses a field-effect transistor (FET) having a gate that is formed of a silicon oxycarbide (SiOC) material, which includes any material that incorporates silicon, oxygen, and carbon into the gate region of a FET. The invention is described with respect to microcrystalline ($\mu c$) SiOC materials, but is understood to include both to and polycrystalline SiOC materials. The SiOC gate FET includes characteristics such as, for example, a lower electron affinity than a conventional polycrystalline silicon (polysilicon) gate FET. The present invention also discloses a tailored SiOC material composition for obtaining particular device characteristics for use in conjunction with a particular gate dielectric, or for particular applications, such as data storage (memory) and imaging.

FIG. 1 is a cross-sectional view illustrating generally, by way of example, one embodiment of a n-channel FET provided by the invention. The invention is understood to also include a p-channel FET embodiment. The n-channel FET includes a source 102, a drain 104, and a gate 106. A gate dielectric, such as thin silicon dioxide (oxide) layer 118 or other suitable insulator, is interposed between gate 106 and substrate 108. In one embodiment, source 102 and drain 104 are fabricated by forming highly doped (n+) regions in a lightly doped (p-) silicon semiconductor substrate 108. In another embodiment, substrate 108 includes a thin semiconductor surface layer formed on an underlying insulating portion, such as in a semiconductor-on-insulator (SOI) or other thin film transistor technology. Source 102 and drain 104 are separated by a predetermined length in which a channel region 110 is formed.

According to one aspect of the invention, gate 106 is formed of silicon oxycarbide (SiOC) material, which includes any material that incorporates silicon, oxygen, and carbon into gate 106. The silicon oxycarbide material forming gate 106 is described most generally as $Si_xO_yC_z$, where x, y, and z are composition variables that define the SiOC material composition. In one embodiment of the present invention, the silicon oxycarbide material forming gate 106 is described more particularly as $SiO_{(2-2w)}C_w$, where the SiOC composition variable defines the empiric relationship between the number of oxygen and carbon atoms in the SiOC compound and the SiOC composition w is between $0<w<1$. For example, but not by way of limitation, SiOC materials having a composition between that of stoichiometric silicon carbide (SiC) and stoichiometric silicon dioxide ($SiO_2$) are included within the present invention.

According to another aspect of the invention, the SiOC composition w is selected at a predetermined value that establishes the value of a barrier energy (also referred to as a barrier potential, potential barrier, tunneling barrier, interface barrier, or barrier) between gate 106 and thin oxide layer 118 (or other gate dielectric). For example, in one embodiment, the SiOC composition is approximated by w=0.5. However, other embodiments of the invention include less oxygen and more carbon (i.e., w>0.5) or less carbon and more oxygen (i.e., w<0.5). For example, but not by way of limitation, one embodiment of the SiOC gate material is illustrated by $0.25<w<0.5$. Another example embodiment is illustrated by way of example, but not by way of limitation, by $0<w<0.4$, such as in a light detector having sensitivity including visible light. Still another embodiment is illustrated by way of example, but not by way of limitation, by $0.5<w<1.0$, such as in a SiOC floating gate memory application having a shorter data charge retention time than a polysilicon gate. As described below, the SiOC composition w is selected as a predetermined value in order to tailor the barrier energy for particular applications. In one embodiment, the SiOC composition w is uniform over a particular integrated circuit die. In another embodiment, the SiOC composition w is differently selected at different locations on the integrated circuit die, such as by additional masking or processing steps, to obtain different device characteristics on the same integrated circuit die.

In one embodiment, an insulating layer, such as silicon dioxide (oxide) 114 or other insulating layer, is formed by chemical vapor deposition (CVD). Oxide 114 isolates gate 106 from other layers, such as layer 112. In another embodiment, gate 106 is oxidized to form at least a portion of oxide 114 isolating gate 106 from other layers such as layer 112. In one embodiment, for example, layer 112 is a polysilicon or other control gate in a floating gate transistor. According to techniques of the present invention, the floating gate transistor is used in an electrically erasable and programmable read-only memory (EEPROM) memory cell, such as a flash EEPROM, or in a floating gate transistor photodetector or imaging device, as described below. In these embodiments, gate 106 is floating (electrically isolated) for charge storage thereupon. The present invention offers considerable advantages to the known EEPROM techniques used for charge storage on floating gate 106. In another embodiment, for example, layer 112 is a metal or other conductive interconnection line that is located above gate 106.

The upper layers, such as layer 112 are covered with a layer 116 of a suitable insulating material in the conventional manner, such as for isolating and protecting the physical integrity of the underlying features. Gate 106 is isolated from channel 110 by an insulating layer such as thin oxide layer 118, or any other suitable dielectric material. In one embodiment, thin oxide layer 118 is a gate oxide layer that can be approximately 100 angstroms (Å) thick, such as for conventional FET operation. In another embodiment, such as in a floating gate transistor, thin oxide layer 118 is a tunnel oxide material that can be approximately 50–100 Å thick.

FIG. 1 illustrates generally, by way of example, a complementary metal-oxide-semiconductor (CMOS) compatible n-channel FET that includes an SiOC gate 106, which may be floating or electrically interconnected. In one embodiment, for example, the FET can be formed on substrate 108 using an n-well CMOS process for monolithic CMOS fabrication of n-channel and p-channel FETs on a common substrate. The invention includes both n-channel and p-channel FET embodiments. Thus, with appropriate doping, the FET of FIG. 1 can be a p-channel FET. The SiOC gate FETs are useful for any application in which conventionally formed polysilicon gate FETs are used, including both electrically driven and floating gate applications.

Figure 2A:
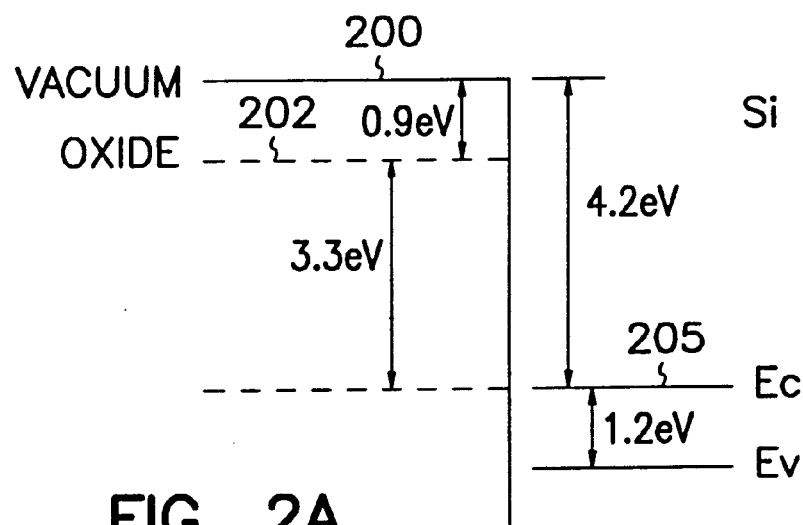
FIGS. 2A and 2B are energy band diagrams that illustrate generally the barrier energy at the interface between gate and an adjacent thin oxide layer (or other gate insulator).

FIG. 2A illustrates generally the barrier energy at the interface between a polysilicon gate and an adjacent thin oxide layer (or other gate insulator). Silicon (monocrystalline or polycrystalline) has a bandgap energy of about 1.2 eV, and an electron affinity, $\chi$, of about 4.2 eV. Silicon dioxide (oxide) has an electron affinity, $\chi$, of about 0.9 eV. The electron affinities, $\chi$, of each of the polysilicon gate and adjacent thin oxide layer are measured with respect to the vacuum level 200, as illustrated in FIG. 2A. In the polysilicon gate, the electron affinity, $\chi$, is defined by the difference between the semiconductor conduction band edge 205 and the vacuum level 200. In the adjacent thin oxide layer, the electron affinity, $\chi$, is defined by the difference between the oxide conduction band 202 and the vacuum level 200. The difference between the polysilicon electron affinity of $\chi \approx 4.2$ eV and the oxide electron affinity of $\chi \approx 0.9$ eV results in a barrier energy at the Si—SiO$_2$ interface between the thin oxide layer and the polysilicon gate of about 3.3 eV. In a memory application using a polysilicon floating gate, the 3.3 eV barrier energy results in long data charge retention times (estimated in millions of years at a temperature of 85 degrees C.). The 3.3 eV barrier energy results in large erasure voltages and long write and erase times, with the accompanying problems described above. In an imaging application using a floating gate, the 3.3 eV barrier energy requires relatively high energy photons (i.e., high frequency and short wavelength) for photoelectric emission of stored electrons from the floating gate.

Figure 2B:
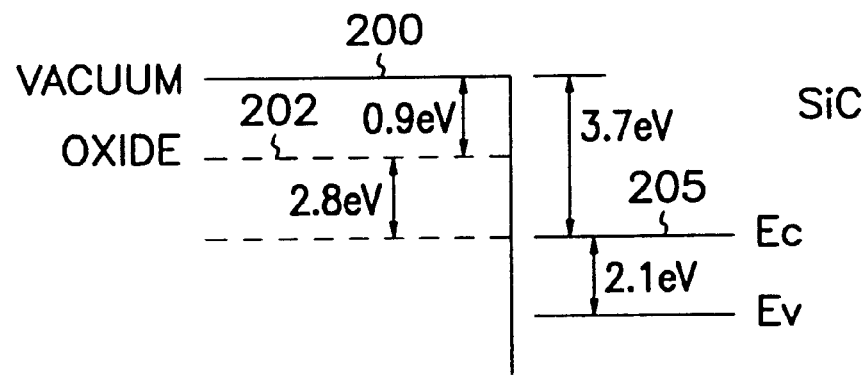

In FIG. 2B, the gate material is approximately stoichiometric silicon carbide (SiC) having an electron affinity of $\chi \approx 3.7$ eV. The electron affinity in the adjacent oxide gate insulator is $\chi \approx 0.9$ eV. The resulting barrier energy is approximately 2.8 eV, which is lower than the 3.3 eV barrier energy obtained using a polysilicon gate. In a memory application using a floating gate, the 2.8 eV barrier energy results in shorter charge retention times than are obtained than in the case described with respect to FIG. 2A, together with smaller erasure voltages and shorter write and erase times. In an imaging application using a floating gate, the 2.8 eV barrier energy requires less photon energy (i.e., lower frequency and longer wavelength) to eject electrons from the floating gate than in the case described with respect to FIG. 2A.

The present invention includes SiOC gate 106, which has particular advantages over polysilicon or SiC gates used in floating and driven gate FETs. For example, the SiOC—SiO$_2$ interface between gate 106 and thin oxide layer 118 provides a lower barrier energy than a Si—SiO$_2$ interface or a SiC—SiO$_2$ interface. Moreover, the SiOC composition w can be selected to tailor the SiOC—SiO$_2$ barrier energy, such as between 2.8 eV and 0 eV, to suit the requirements of a particular application, as explained below.

Figure 3:
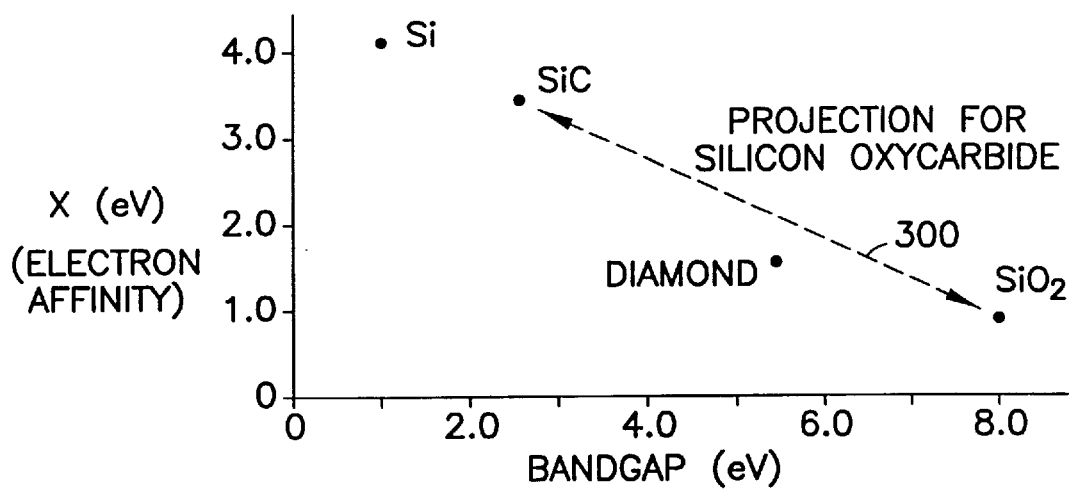
FIG. 3 is a graph that illustrates generally electron affinity, $\chi$, as a function of bandgap energy.

FIG. 3 is a graph that illustrates generally electron affinity, $\chi$, as a function of bandgap energy. Silicon, Diamond (C), SiC, and SiO$_2$ are illustrated, together with region 300 that illustrates the expected range of SiOC electron affinity 0.9 eV$<\chi<$3.7 eV as the SiOC composition w varies between w$\approx$1 (i.e., approximately SiC) and w$\approx$0 (i.e., approximately SiO$_2$). The SiOC—SiO$_2$ interface barrier energy is given by the difference between the SiOC electron affinity 0.9 eV$<\chi<$3.7 eV as the SiO$_2$ electron affinity of 0.9 eV. At the SiOC—SiO$_2$ interface, the resulting barrier energy can therefore be established at a value approximately between 2.8 eV and 0 eV by selecting a predetermined value of the SiOC composition w.

Figure 4:
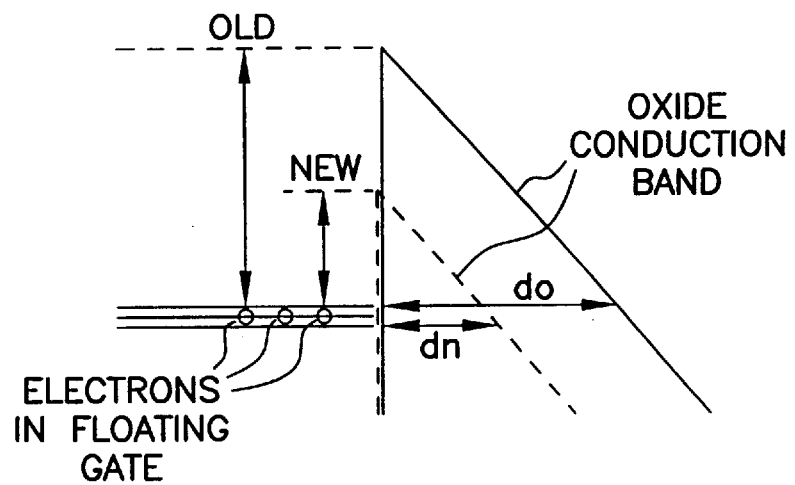
FIG. 4 is a graph that illustrates generally barrier energy height versus tunneling distance for SiOC and conventional polysilicon gates.

FIG. 4 is a graph illustrating generally barrier energy versus tunneling distance for SiOC and conventional polysilicon gates. The SiOC electron affinity provides a smaller barrier energy than a polysilicon or even a SiC gate. The smaller SiOC barrier energy reduces the energy to which the electrons must be excited to be stored on the SiOC gate 106 by thermionic emission. The smaller barrier energy also reduces the distance that electrons stored on the gate have to traverse, such as by Fowler-Nordheim tunneling, to be stored upon or removed from the SiOC gate 106. The reduced tunneling distance allows easier charge transfer, such as while writing or erasing data in a floating gate transistor in a flash EEPROM memory cell. In FIG. 4, "do" represents the tunneling distance of a typical polysilicon floating gate transistor due to the barrier energy represented by the dashed line "OLD". The tunneling distance "dn" corresponds to a SiOC gate 106 and its smaller barrier energy represented by the dashed line "NEW". Even a small reduction in the tunneling distance results in a large increase in the tunneling probability, because the tunneling probability is an exponential function of the reciprocal of the tunneling distance.

Floating Gate Memory Device

In one embodiment, the invention provides a memory device including an SiOC floating gate transistor. Floating gate 106 can be programmed, by way of example, but not by way of limitation, by providing about 12 volts to control gate 112, and providing about 6 volts to drain 104, and providing about 0 volts to source 102. This creates an inversion layer in channel region 110, in which electrons are accelerated from source 102 toward drain 104, thereby acquiring substantial kinetic energy. High energy "hot electrons" are injected through thin oxide layer 118 onto the SiOC floating gate 106. Floating gate 106 accumulates the hot electrons as stored data charges.

The change in the charge stored on floating gate 106 changes the threshold voltage of the n-channel floating gate FET of FIG. 1. When control gate 112 is driven to a read voltage during a read operation, the change in charge stored on floating gate 106 results in a change in current between drain 104 and source 102. Thus, detection of the change in charge stored on floating gate 106 by sensing drain-source current conductance advantageously uses the appreciable transconductance gain of the floating gate FET of FIG. 1. Either analog or digital data can be stored as charge on floating gate 106 and read back as a conductance between drain region 104 and source region 102.

In one embodiment, the SiOC composition w of the floating gate 106 is at a predetermined value 0<w<1 to establish the exact barrier energy at the SiOC—SiO$_2$ interface between the SiOC floating gate and SiO$_2$ or other adjacent gate insulator. The lower barrier energy and increased tunneling probability of the SiOC gate 106 advantageously provides faster programming and erasure times for floating SiOC gate transistors in flash EEPROM memories. This is particularly advantageous for "flash" EEPROMs in which many floating gate transistor memory cells must be erased simultaneously. The large charge that must be transported by Fowler-Nordheim tunneling during the erasure of a flash EEPROM typically results in relatively long erasure times. By reducing the tunneling distance and increasing the tunneling probability, the SiOC gate 106 reduces erasure times in flash EEPROMs.

The increased tunneling probability of the SiOC gate 106 also advantageously reduces the voltage required for writing and erasure of the SiOC floating gate transistor. Polysilicon floating gate transistors typically require complicated and noisy on-chip charge pump circuits to generate the large erasure voltage, which typically far exceeds other voltages required on the integrated circuit. The lower erasure voltages of the SiOC floating gate transistor are more easily provided by simpler on-chip circuits. Lower erasure voltages also reduce hole injection into the gate dielectric that can cause erratic overerasure, damage to the gate dielectric, and introduction of trapping states in the gate dielectric. Reducing the erasure voltage also lowers the electric fields, minimizing reliability problems that can lead to device failure, and better accommodating downward scaling of device dimensions.

Figure 5:
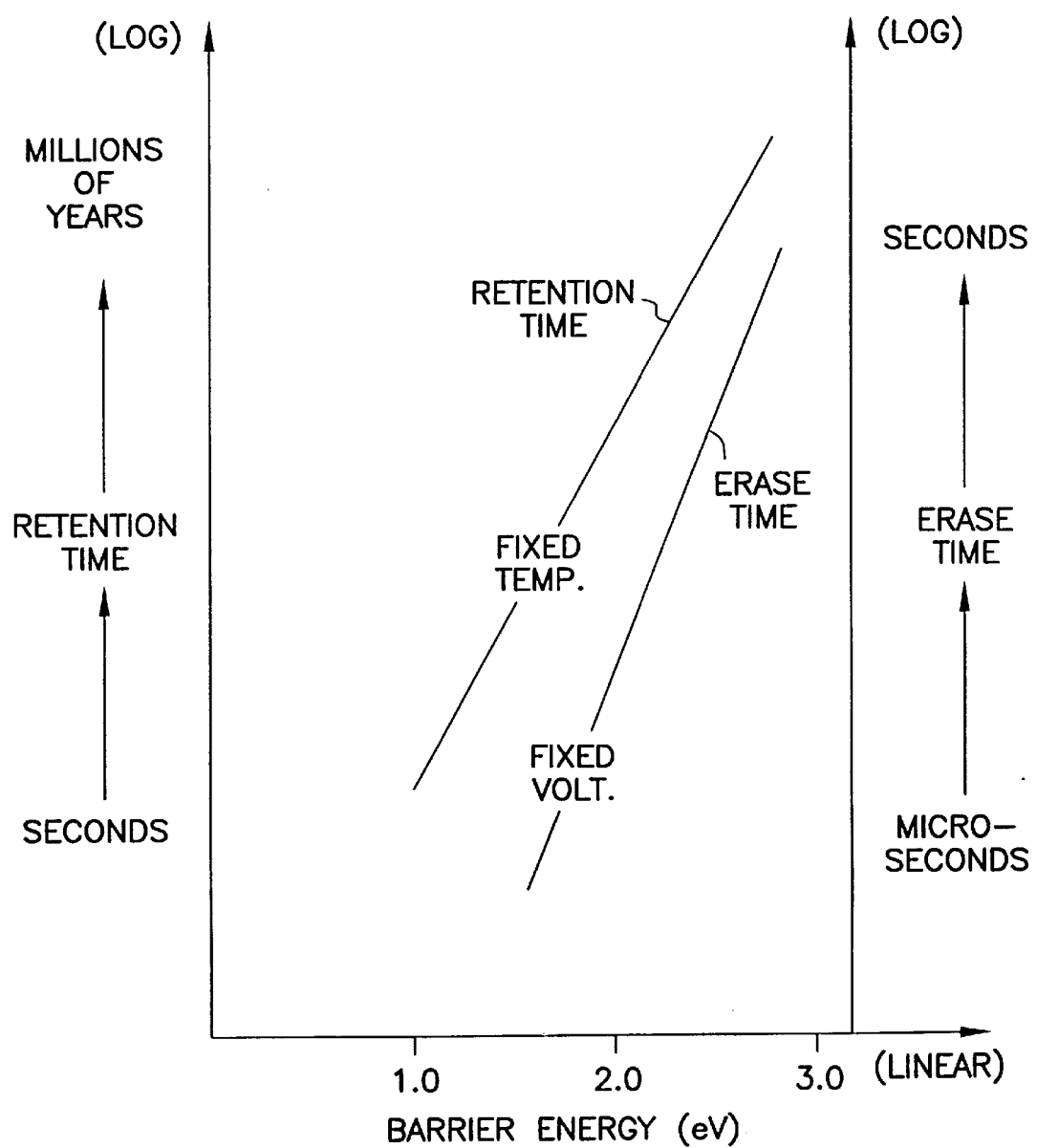
FIG. 5 is a graph that illustrates generally the relationship between retention time and barrier energy, and also the relationship between erase time and barrier energy.

Lowering the barrier energy also decreases the data charge retention time of the charge stored on the SiOC floating gate 106. Conventional polysilicon floating gates have a data charge retention time estimated in the millions of years at a temperature of 85 degrees C. Since such long data charge retention times are longer than what is realistically needed, a shorter data charge retention time can be accommodated in order to obtain the benefits of a smaller barrier energy. According to one aspect of the present invention, the SiOC composition w is selected to establish the particular data charge retention time. In one embodiment, the exact value of the SiOC composition w is selected to establish a barrier energy that is large enough to prevent electrons from being thermally excited over the barrier at high operating temperatures, such as at a temperature of 85° C., as this could allow the stored data charges to leak from the floating gate over a long period of time. For example, the data charge retention time can be selected between seconds and millions of years by selecting the value of the SiOC composition w. For example, by selecting the SiOC composition w to provide data charge retention times on the order of seconds, then the memory device can be made to emulate a dynamic random access memory (DRAM). In another example, by selecting the SiOC composition w to provide data charge retention times on the order of years, then the memory device can be made to emulate a hard disk drive. According to one aspect of the present invention, one memory device provides different memory functions by selecting the SiOC composition w such as, for example, approximately between 0.5<w<1.0. In one embodiment, floating gate transistors having different SiOC compositions are provided on the same integrated circuit, thereby providing differently functioning memory cells (e.g., having different data charge retention times) on the same integrated circuit FIG. 5 is a conceptual diagram, using rough order of magnitude estimates, that illustrates generally how erase and retention times vary with the barrier energy for a particular value of erasure voltage at a particular temperature of 85° C. The probability of thermal excitation and emission over or tunneling through the barrier is an exponential function of the barrier energy. A lower barrier energy provides exponentially shorter erase and retention times. The particular memory application requirements determine the needed memory retention time, whether seconds or years. From this memory retention time, the barrier energy required and the erase time for a particular voltage can be determined using an engineering graph similar to that of FIG. 5. In one embodiment, the SiOC composition w is selected to provide a retention time on the order of seconds or years, depending upon the function required for the memory device. According to one aspect of the present invention, for example, the memory device can emulate or replace DRAMs or hard disk drives by selecting the SiOC composition w to establish the appropriate data charge retention time.

Figure 6:
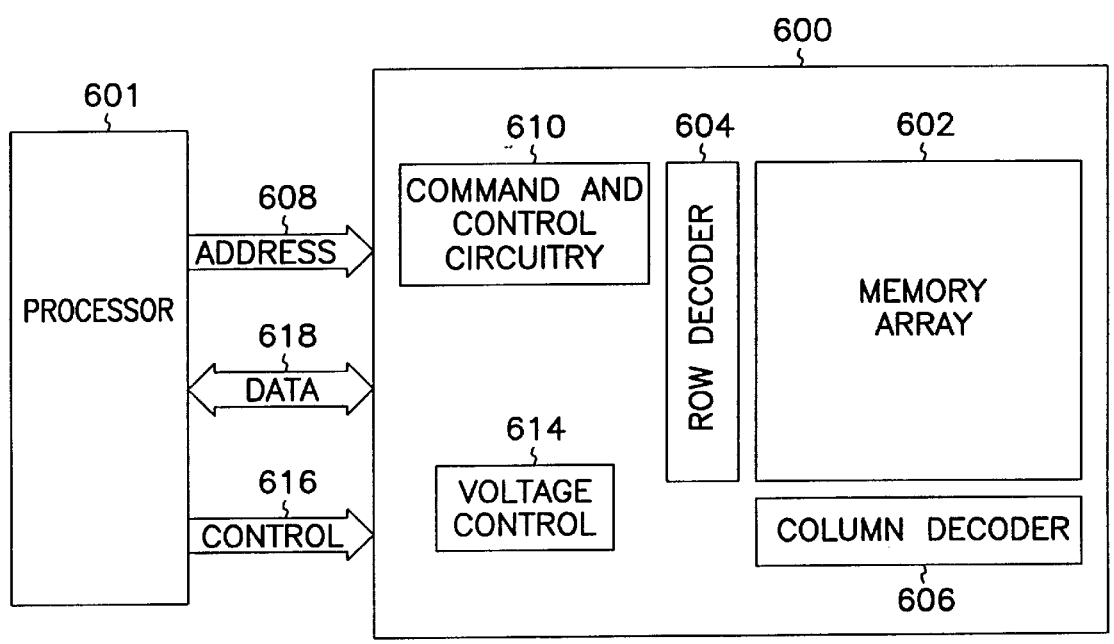
FIG. 6 is a schematic/block diagram that illustrates generally a flash EEPROM memory having memory cells that include an SiOC gate transistor according to the present invention.

FIG. 6 is a simplified block diagram illustrating generally one embodiment of a memory 600 system, according to one aspect of the present invention, in which SiOC gate FETs are incorporated. In one embodiment, memory 600 is a flash EEPROM, and the SiOC gate FETs are floating gate transistors that are used for nonvolatile storage of data as charge on the SiOC floating gates 106. However, the SiOC gate FETs can have electrically interconnected gates 106, and can be used in other types of memory systems, including SDRAM, SLDRAM and RDRAM devices, or in programmable logic arrays (PLAs), or in any other application in which transistors are used.

FIG. 6 illustrates, by way of example, but not by way of limitation, a flash EEPROM memory 600 comprising a memory array 602 of multiple memory cells. Row decoder 604 and column decoder 606 decode addresses provided on address lines 608 to access addressed SiOC gate floating gate transistors in the memory cells in memory array 602. Command and control circuitry 610 controls the operation of memory 600 in response to control signals received on control lines 616 from a processor 601 or other memory controller during read, write, and erase operations. Voltage control 614 is provided to apply appropriate voltages to the memory cells during programming and erasing operations. It will be appreciated by those skilled in the art that the memory of FIG. 6 has been simplified for the purpose of illustrating the present invention and is not intended to be a complete description of a flash EEPROM memory.

Floating Gate Imaging Device

According to another aspect of the present invention, the SiOC floating gate transistor of FIG. 1 is used in light detection applications, such as a photodetector or imaging device. In this embodiment of the invention, light is detected by the absorption of photons by the SiOC floating gate 106. This is distinguishable from other types of imaging devices, such as sensors using a charge-coupled device (CCD) or a photodiode detector, in which light is absorbed in the semiconductor substrate, thereby producing charge carriers that are detected.

According to one embodiment of the present invention, charge is stored on the SiOC floating gate 106, such as by known EEPROM charge storage techniques. The imaging device is exposed to incident light. Incident photons having enough energy to eject an electron by photoelectric emission from floating gate 106 are detected by a resulting change in drain-source conductance of the imaging device. Thus, the light detector of the present invention advantageously utilizes the appreciable transconductance gain of the floating gate transistor. In one embodiment of the invention, the wavelength to which the light detector is sensitive is established by selecting the SiOC composition w of floating gate 106.

Figure 7:
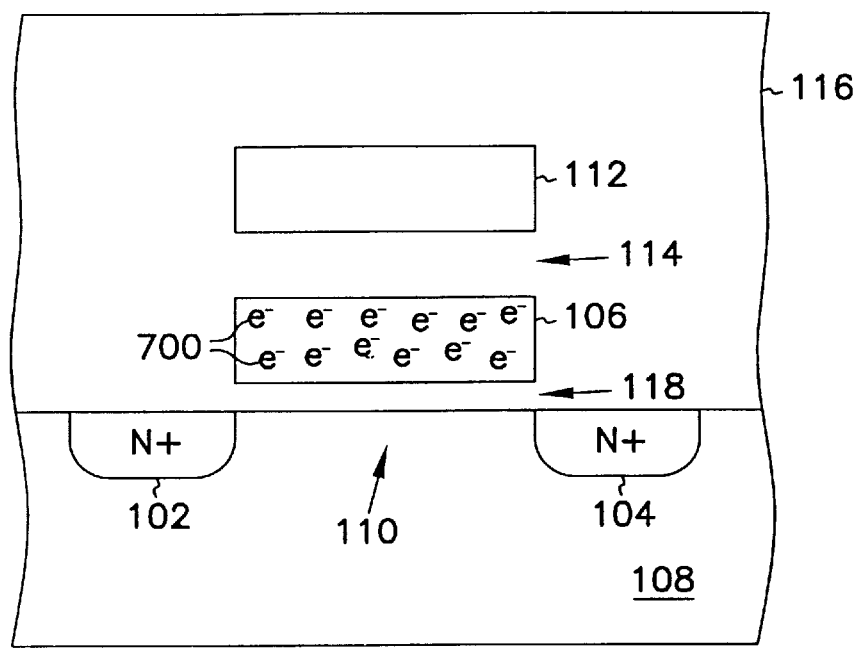
FIG. 7 is a cross-sectional schematic diagram of the floating gate transistor that illustrates generally its application according to the present invention as a light detector or imaging device.

FIG. 7 is a cross-sectional schematic diagram of the floating gate transistor that illustrates generally its application according to the present invention as a light detector or imaging device. In FIG. 7, floating gate 106 is charged by the injection of hot electrons 700 through thin oxide layer 118 under the SiOC floating gate 106. This change in charge on floating gate 106 changes the threshold voltage of the n-channel floating gate FET. As a result, when control gate 112 is driven to a read voltage during a read operation, a large change in drain-source current is obtained through the transconductance gain of the floating gate transistor.

Figure 8:
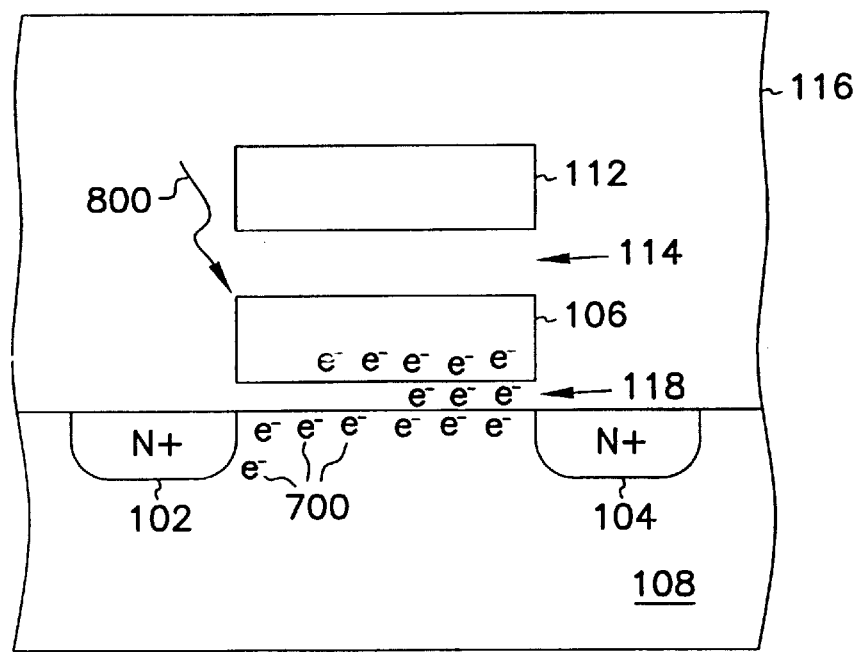
FIG. 8 is a cross-sectional schematic diagram that illustrates generally how incident light is detected by the absorption of photons by the floating gate.

FIG. 8 is a cross-sectional schematic diagram that illustrates generally how incident light 800 is detected by the absorption of photons by floating gate 106. The photons must have enough energy to cause electrons 700 stored on floating gate 106 to overcome the barrier at the interface between floating gate 106 and thin oxide layer 118 and be ejected from floating gate 106 back into the semiconductor or SOI substrate by the photoelectric effect. A small electric field in thin oxide layer 118, such as results from the presence of electrons 700 stored on floating gate 106, assists in emission of electrons 700 toward substrate 108. Detection or imaging of visible wavelengths of incident light 800 requires a low electron affinity floating gate 106. The present invention allows the electron affinity of floating gate 106 to be tailored by selecting the particular value of the SiOC composition of floating gate 106.

Figure 9:
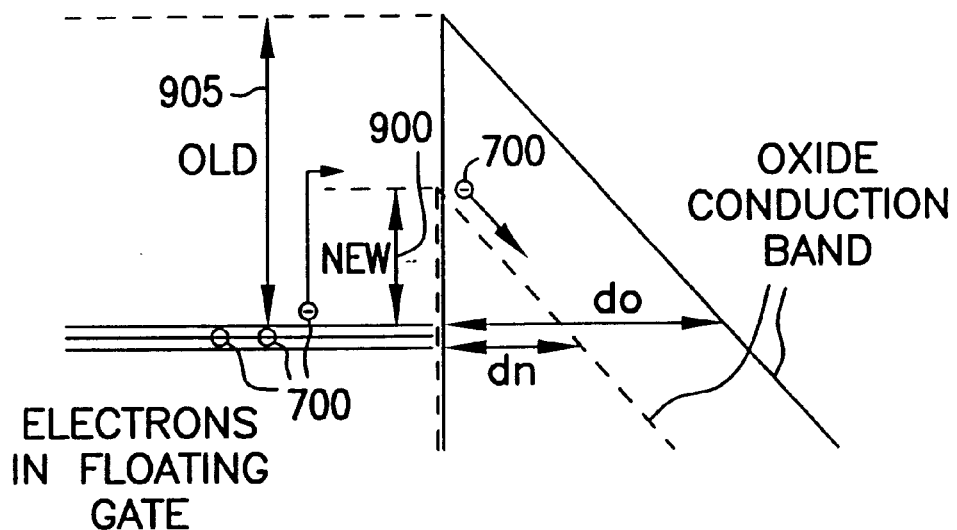
FIG. 9 is a graph illustrating generally barrier energy versus tunneling distance, and further illustrating the absorption of light energy by the floating gate.

FIG. 9 is a graph illustrating generally barrier energy versus tunneling distance, and illustrating the absorption of light energy by the floating gate. In FIG. 9, incident photons impart sufficient energy to electrons 700 stored on floating gate 106. The electrons 700 can therefore overcome the "new" barrier 900, which represents the barrier energy at an SiOC—SiO$_2$ interface. As a result, electrons 700 are ejected from floating gate 106 back toward the semiconductor or SOI substrate 108, thereby discharging floating gate 106. "Old" barrier 905, which represents the barrier energy at a Si—SiO$_2$ interface, is higher than "new" barrier 900 of the SiOC—SiO$_2$ interface. As a result, a light detector having an SiOC floating gate 106 is sensitive to lower energy photons than a light detector having an polysilicon (Si) floating gate. Similarly, a light detector having an SiOC floating gate 106 is sensitive to lower energy photons than a light detector having a SiC floating gate.

In one embodiment, SiOC floating gate 106 is doped n-type to maximize the number of conduction band electrons 700 in floating gate 106, thereby increasing the absorption of incident light by photoelectric emission. Visible light has a photon energy of about 2 eV. For detection of visible light, the barrier energy at the interface between floating gate 106 and thin oxide layer 118 should be less than or equal to about 2 eV. However, most common gate materials have larger barrier energies at an interface with an adjacent silicon dioxide insulator. For example, a conventional polysilicon floating gate 106 results in a barrier energy of about 3.3 eV.

According to one aspect of the present invention, SiOC is used as the material for floating gate 106. The SiOC composition w is selected for sensitivity to particular wavelengths of light, and the barrier energy is established accordingly. For example, in one embodiment, the SiOC composition w is selected in the range approximated by 0<w<0.4 such that barrier energy is less than or equal to about 2 eV. As a result, the floating gate transistor light detector's sensitivity includes visible light. According to another aspect of the invention, the floating gate transistor light detector is made sensitive to different portions of the light spectrum by adjusting the barrier energy through the selection of the SiOC composition w. The SiOC composition w can also be different for different floating gate transistors, such as on the same integrated circuit, in order to yield different sensitivities to different wavelengths of light.

Figure 10:
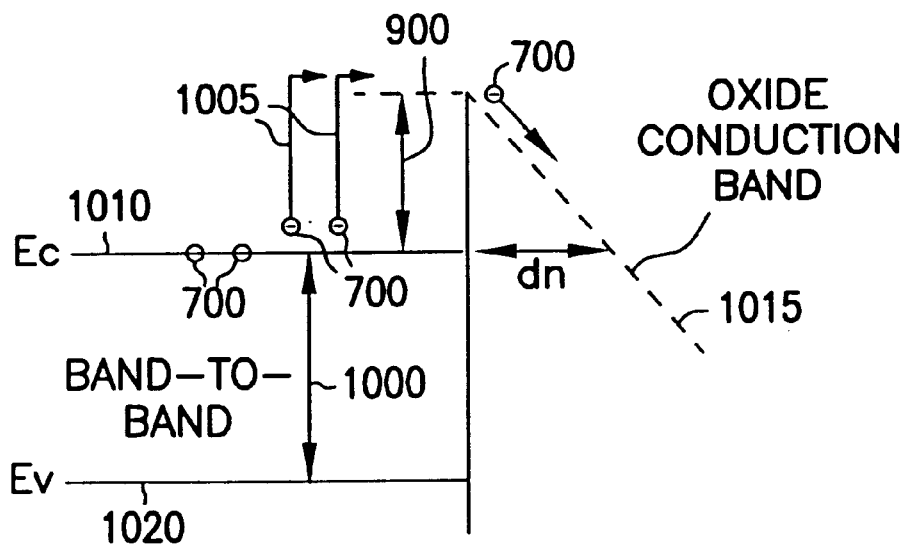
FIG. 10 is a graph illustrating generally barrier energy versus tunneling distance, and distinguishing photoelectric absorption of incident light in the SiOC floating gate from valence-to-conduction band electron transitions.

FIG. 10 illustrates generally how the above-described absorption of incident photons in the SiOC floating gate 106 by photoelectric emission is distinguishable from, and independent of, valence-to-conduction band electron transitions, which is the common photon absorption mechanism of most diode or CCD photodetectors or imaging devices. Light detection by conventional photon absorption is illustrated by the band-to-band electron energy transition 1000. Light detection by photon absorption according to the present invention is illustrated by the photoelectric emission 1005 of a conduction band electron 700 from floating gate 106 over the barrier 900 between the floating gate conduction band 1010 and oxide conduction band 1015.

The semiconductor bandgap is defined by the energy difference between the semiconductor conduction band 1010 and semiconductor valence band 1020. Exciting an electron from a valence band 1020 low energy state to a conduction band 1010 high energy state requires absorption of an incident photon of energy exceeding the bandgap of the semiconductor material. For the large bandgap of SiOC, these band-to-band transitions occur only at very high photon energies, such as for ultraviolet light. By contrast, photoelectric emission 1005 of electrons from the SiOC floating gate 106 only requires that the incident photon energy exceed the barrier energy 900 between floating gate 106 and thin oxide layer 118. Since the present invention allows the barrier energy 900 to be less than the 2 eV energy of a visible photon by an appropriate selection of the SiOC composition w, a wide spectrum of light detection is obtained.

In conventional photodetectors, only high energy photons are detected as the bandgap is increased (i.e., as the bandgap becomes larger, first red, then blue, and finally ultraviolet light is required for band-to-band photon absorption). According to the present invention, a larger bandgap typically results in a smaller barrier energy 900, thereby allowing detection of even lower energy photons as the bandgap is increased (i.e., as the bandgap becomes larger, the detector becomes sensitive not only to ultraviolet, but to blue, then red, and finally to infrared wavelengths). As a result, the present invention can be used for visible and infrared light detection and imaging, including camera-like operations, and can employ lenses, shutters, or other such known imaging techniques.

Figure 11:
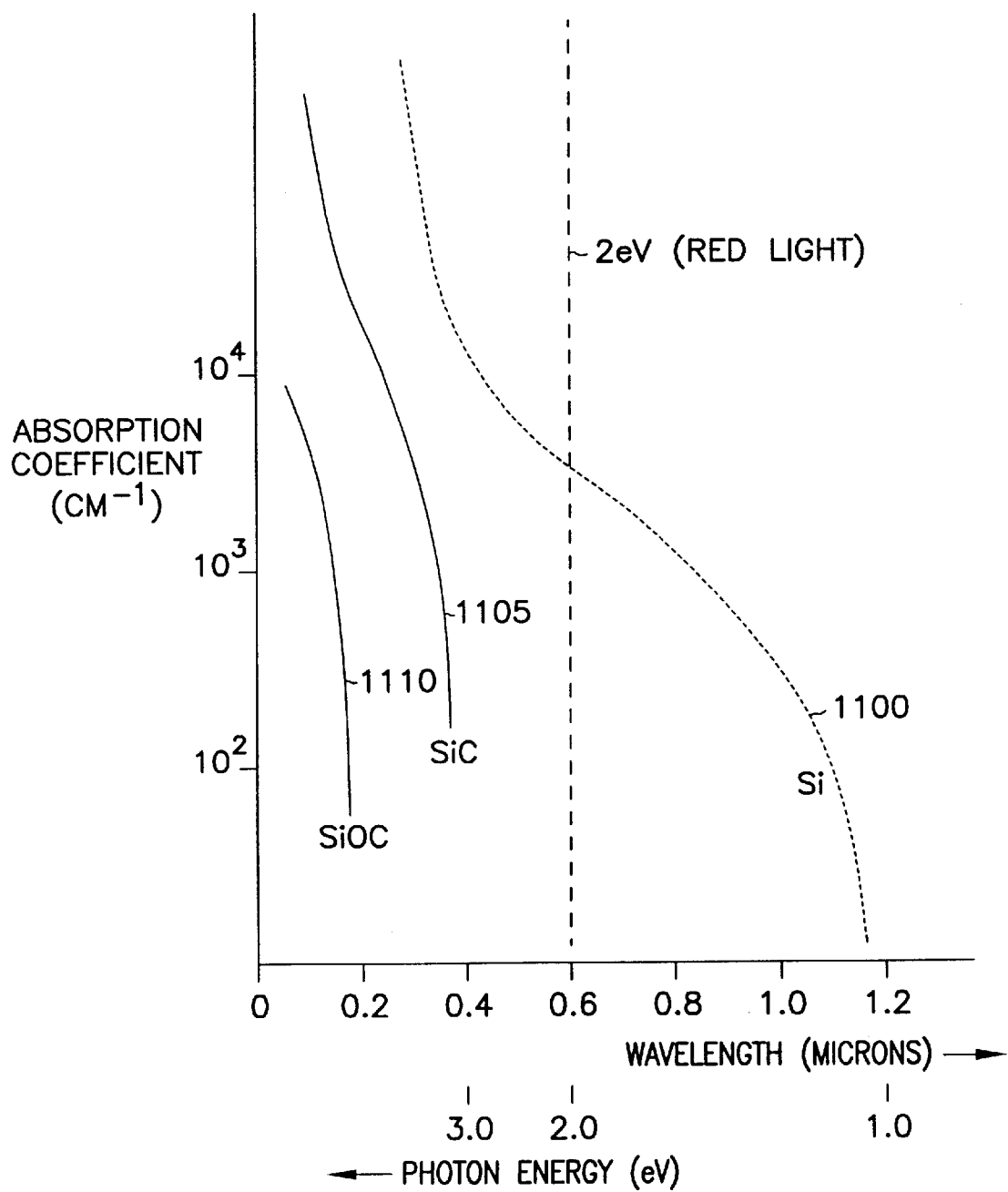
FIG. 11 is a graph that illustrates generally, by way of example, absorption coefficients as a function of wavelength and photon energy.

FIG. 11 is a graph that illustrates generally, by way of example, the band-to-band absorption coefficient as a function of wavelength and photon energy for several different materials. Band-to-band light absorption by Si, SiC, and SiOC materials are illustrated generally by lines 1100, 1105, and 1110, respectively, which require progressively higher photon energies. By contrast, photoelectric emission of electrons from floating gate 106, according to the present invention, requires progressively lower photon energies as the material composition is changed from Si to SiC to SiOC.

For example, red light has a photon energy of approximately 2 eV. Since the bandgap of SiOC is much higher than 2 eV, band-to-band photon absorption of red light is minimal, as seen in FIG. 11. However, the SiOC composition w is selected such that the barrier energy between SiOC floating gate 106 and adjacent thin oxide layer 118 is much less than 2 eV. In this embodiment, incident photons generate negligible electron-hole pairs or valence-to-conduction band transitions in floating gate 106. Instead, absorption of photons is substantially entirely the result of photoelectric emission of previously stored electrons from floating gate 106. While the quantum efficiency associated with the photoelectric effect can be low (e.g., less than one electron emitted per one hundred photons) the floating gate transistor offers appreciable transconductance gain. Emitting a single electron from the floating gate 106 changes the number of electron flowing out of the drain 104 by thousands. By adjusting the SiOC composition w of floating gate 106, the floating gate light detector device can be adjusted for optimum response over almost the entire optical spectrum, from infrared through visible light to ultraviolet.

The SiOC gate 106 is doped to enhance its conductivity. In floating gate applications, the SiOC film need not be very conductive since it is not used for interconnection wiring. An SiOC floating gate 106 need only be sufficiently conductive to allow for redistribution of carriers in the floating gate 106. In one embodiment, the SiOC floating gate 106 is doped n-type, to increase the number of conduction band electrons stored on floating gate 106, thereby increasing the sensitivity of the photodetector.

Process

FIGS. 12A, 12B, 12C, 12D, 12E, 12F, and 12G illustrate generally examples of CMOS-compatible process steps for fabricating n-channel and p-channel SiOC gate FETs according to the present invention, including the fabrication of SiOC floating gate transistors. The transistors can be produced on a silicon or other semiconductor substrate, an SOI substrate, or any other suitable substrate 108. Only the process steps that differ from conventional CMOS process technology are described in detail.

Figure 12A:
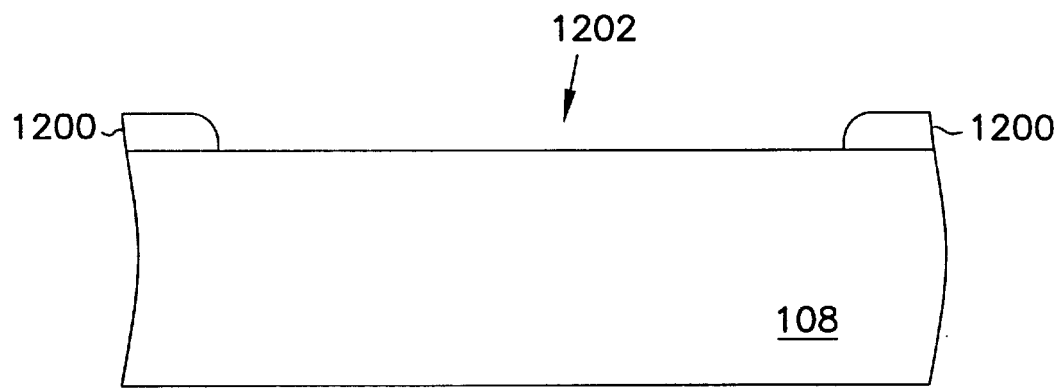
FIGS. 12A, 12B, 12C, 12D, 12E, 12F and 12G are cross-sectional schematic diagrams that illustrate generally examples of process steps for fabricating n-channel and p-channel SiOC gate FETs according to the present invention, including the fabrication of SiOC floating gate transistors.

In FIG. 12A, substrate 108 undergoes conventional CMOS processing up to the formation of the gate structure. For example, field oxide 1200 is formed for defining active regions 1202. In a bulk semiconductor embodiment, well regions are formed, such as for carrying p-channel transistors.

Figure 12B:
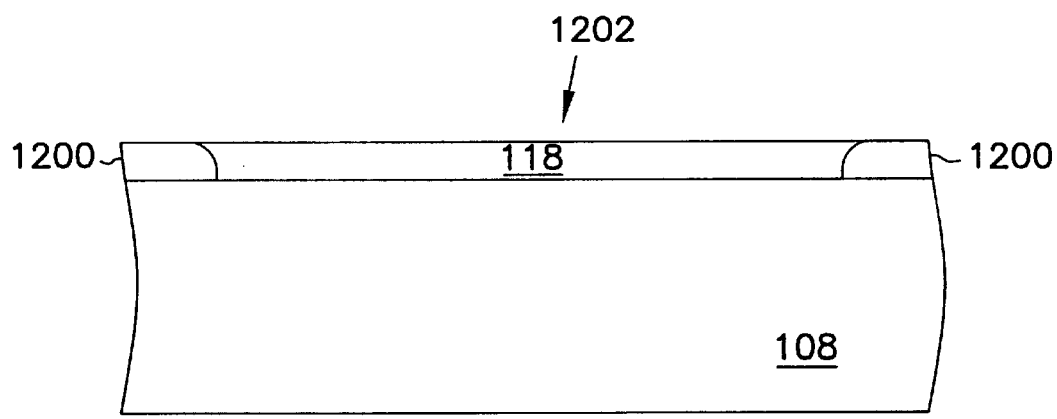

In FIG. 12B, an insulating layer, such as thin oxide layer 118 or other suitable insulator, is formed on substrate 108, such as by dry thermal oxidation, including over the portions of the active regions 1202 in which transistors will be fabricated. In one embodiment, thin oxide layer 118 is a gate oxide layer that can be approximately 100 angstroms (Å) thick. In another embodiment, such as in a floating gate transistor, thin oxide layer 118 is a tunnel oxide material that can be approximately 50–100 Å thick.

Figure 12C:
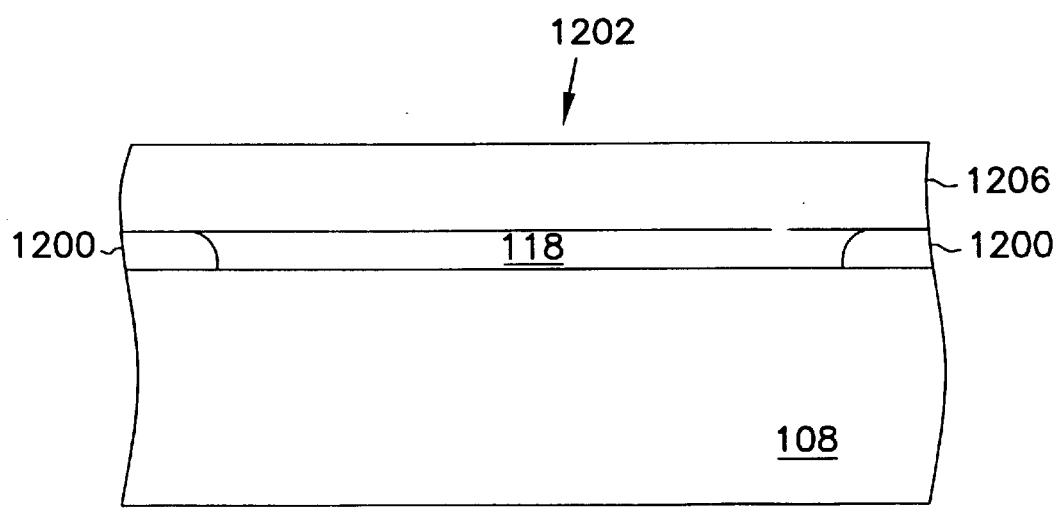

In-FIG. 12C, a thin film 1206 of conductively doped polycrystalline or microcrystalline SiOC is then deposited, such as by chemical vapor deposition (CVD) over the entire wafer, including over thin oxide layer 118. The SiOC composition w of film 1206 is differently selected according to the particular barrier energy desired at the interface between the gate 106 and adjacent thin oxide layer 118, as described above.

The SiOC film 1206 can be in situ doped during deposition, or doped during a subsequent ion-implantation step. The conductive doping can be n-type or p-type. In one light detecting embodiment, the SiOC film 1206 is conductively doped n-type for enhanced photoelectric emission of electrons from floating gate 106 in response to incident light, as described above. In another embodiment, the SiOC film 1206 is conductively doped p-type using a boron dopant, which advantageously diffuses from the SiOC gate 106 less easily than from a polysilicon gate during subsequent thermal processing steps.

In one embodiment, for example, SiOC film 1206 is deposited using a Two Consecutive Decomposition and Deposition Chamber (TCDDC) system, providing the structure illustrated in FIG. 12C. One such example of depositing SiOC, in the unrelated technological application of solar cells, is disclosed in an article by R. Martins et al., entitled "Transport Properties of Doped Silicon Oxycarbide Microcrystalline Films Produced By Spatial Separation Techniques," *Solar Energy Materials and Solar Cells*, Vol. 41–42, pp. 493–517, June 1996. See also an article by R. Martins et al., entitled "Wide band-gap microcrystalline silicon thin films," *Diffusion and Defect Data Part B (Solid State Phenomena)*, Vol. 44–46, Pt. 2, pp. 299–346, 1995.

Figure 12D:
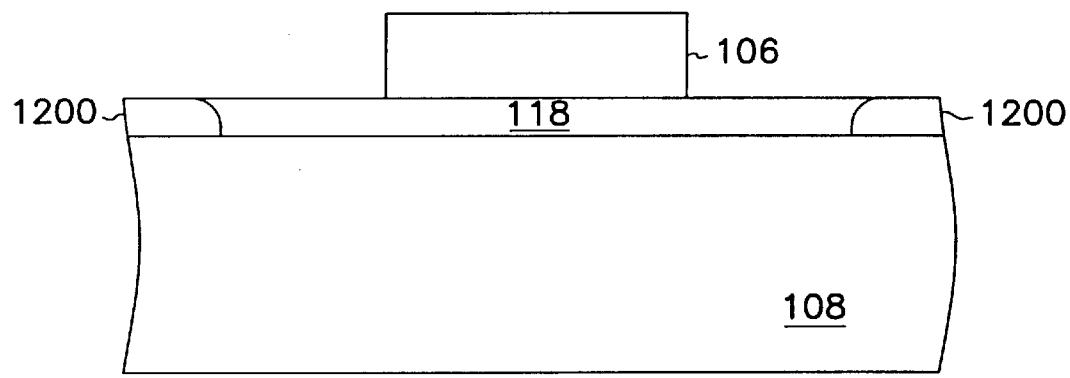

SiOC film 1206 can also be deposited using other techniques such as, for example, low pressure chemical vapor deposition (LPCVD), or enhanced CVD techniques known to those skilled in the art including low pressure rapid thermal chemical vapor deposition (LP-RTCVD). The conductivity of the SiOC film 1206 can be changed by ion implantation during subsequent process steps, such as during the self-aligned formation of source/drain regions for the n-channel and p-channel FETs. In FIG. 12D, SiOC film 1206 is patterned and etched, together with the adjacent thin oxide layer 118, to form SiOC gate 106. SiOC film 1206 is patterned using standard techniques and is etched using plasma etching, reactive ion etching (RIE) or a combination of these or other suitable methods. The etch rate of SiOC film 1206 can be significantly increased by using magnetron enhanced RIE.

Figure 12E:
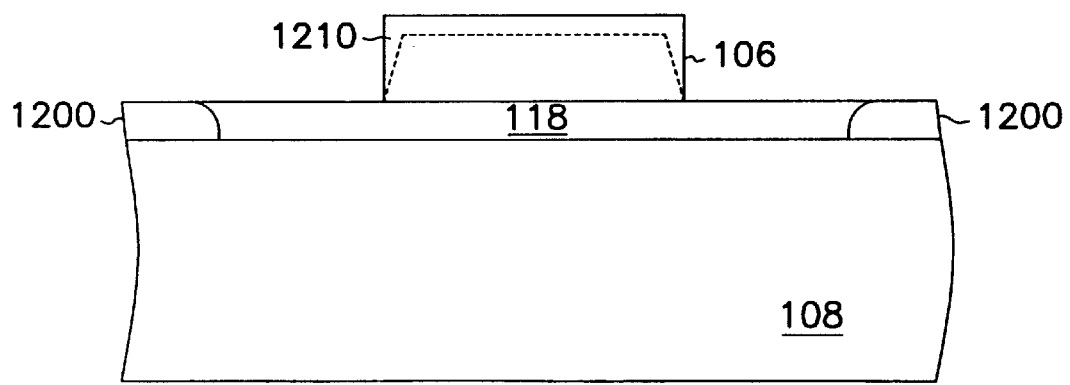

FIG. 12E illustrates one embodiment in which SiOC gate 106 is oxidized after formation, providing a thin layer 1210 represented by the dashed line in FIG. 12E. SiOC gate 106 can be oxidized, for example, by plasma oxidation similar to reoxidation of polycrystalline silicon. During the oxidation process, the carbon is oxidized as carbon monoxide or carbon dioxide and vaporizes, leaving the thin layer 1210 of silicon oxide over SiOC gate 106. In one embodiment, thin layer 1210 is used as, or as a portion of, an intergate dielectric between floating and control gates in a floating gate transistor embodiment of the present invention.

Figure 12F:
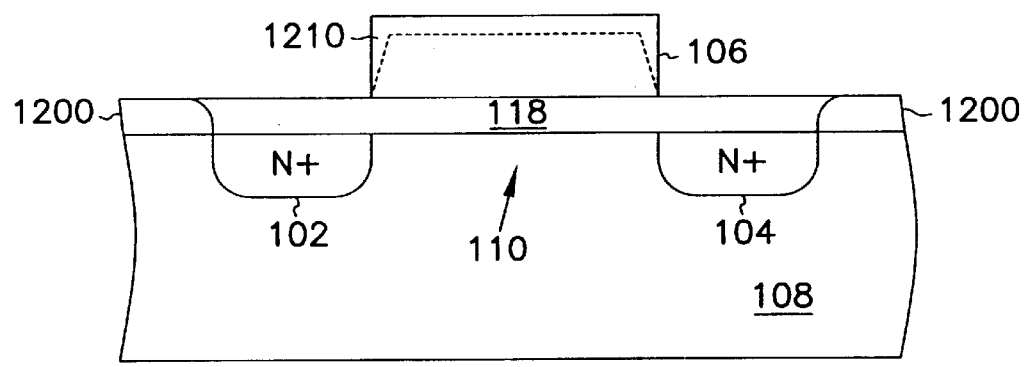

FIG. 12F illustrates generally a self-aligned embodiment of the formation of n-channel FET n+ source region 102 and drain region 104. For a p-channel FET, p+ source drain regions can be similarly formed. The doping of SiOC gate 106 can be changed by ion implantation, such as during the formation of n-channel FET or p-channel FET source/drain regions, or subsequently thereto. For example, a p-type SiOC film 1206 can be deposited, and its doping then changed to n+ by leaving SiOC gate 106 unmasked during the formation of the n+ source region 102 and drain region 104 for the n-channel FET.

Figure 12G:
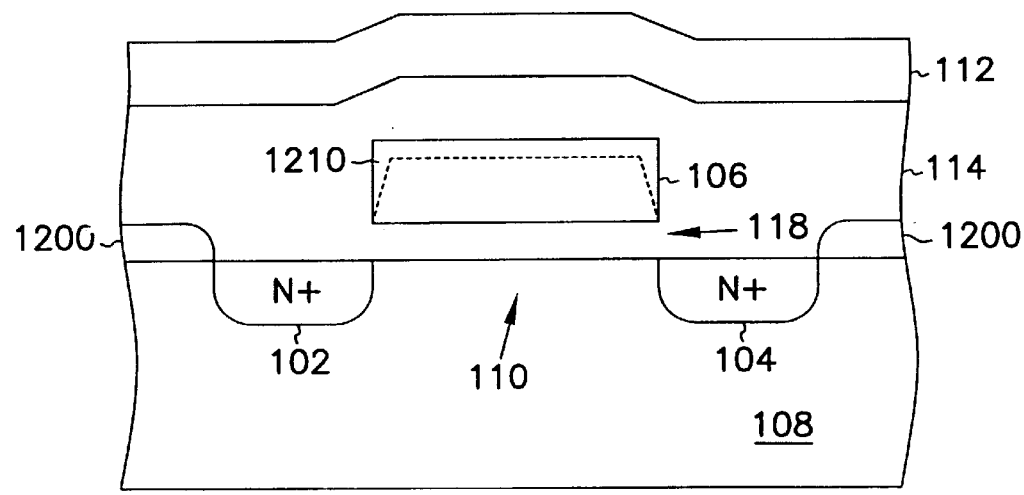

FIG. 12G illustrates generally the formation of an insulating layer, such as oxide 114 or other suitable insulator, after formation of n-channel FET source region 102 and drain region 104. In one embodiment, oxide 114 is deposited over the upper surface of the integrated circuit structure using a standard CVD process. Oxide 114 isolates SiOC gate 106 from other gates such as, for example, an overlying or adjacent control gate layer 112 where SiOC gate 106 is a floating gate in a floating gate transistor. Oxide 114 also isolates SiOC gate 106 from any other conductive layer 112, such as polysilicon layers, gates, metal lines, etc., that are fabricated above or over SiOC gate 106 during subsequent process steps.

Conclusion

The invention includes a CMOS-compatible FET having a low electron affinity SiOC gate that is either electrically isolated (floating) or interconnected. The SiOC composition w is selected to provide the desired barrier energy at the SiOC—$SiO_2$ interface, such as $0<w<0.4$, or $0.5<w<1.0$. In a flash EEPROM application, the SiOC composition w is selected to provide the desired programming and erase voltage and time or data charge retention time. In an imaging application, the SiOC composition w is selected to provide sensitivity to the desired wavelength of light. Unlike conventional photodetectors, light is absorbed in the floating gate, thereby ejecting previously stored electrons therefrom. Also unlike conventional photodetectors, the light detector according to the present invention is actually more sensitive to lower energy photons as the semiconductor bandgap is increased.

Although specific embodiments have been illustrated and described herein, those of ordinary skill in the art will appreciate that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of fabricating a transistor on a semiconductor substrate, the method comprising:
   forming a source region and a drain region in a semiconductor substrate, a channel region being between the source region and the drain region in the semiconductor substrate;
   forming an insulating layer on the channel region;
   forming a gate on the insulating layer, wherein the gate comprises a silicon oxycarbide compound $SiO_{(2-2w)}C_w$; and
   selecting w at a value approximately between 0 and 1.0.

2. The method of claim 1, wherein w is selected to establish the value of a barrier energy between the gate and the insulating layer.

3. The method of claim 2, wherein the value of the barrier energy is approximately between 0 eV and 2.8 eV, as determined by the selected value of w.

4. The method of claim 1, wherein w is selected at a predetermined value that is approximately between 0 and 0.4.

5. The method of claim 1, wherein w is selected at a predetermined value that is approximately between 0.5 and 1.0.

6. The method of claim 1, wherein the gate is a floating gate and w is selected to provide a desired charge retention time of the floating gate.

7. The method of claim 6, wherein w is selected to provide the charge retention time of approximately between 1 second and $10^6$ years.

8. The method of claim 1, wherein the gate is a floating gate, and w is selected to establish the wavelength of light absorbed by the floating gate.

9. The method of claim 8, wherein w is selected to provide sensitivity to infrared light.

10. The method of claim 8, wherein w is selected to provide sensitivity to visible light.

11. The method of claim 8, wherein w is selected to provide sensitivity to ultraviolet light.

12. The method of claim 1, wherein forming a gate further comprises:
   depositing the silicon oxycarbide compound $SiO_{(2-2w)}C_w$ on the insulating layer using chemical vapor deposition to form a layer of gate material on the insulating layer; and
   etching the gate material to a desired pattern using a reactive ion etch process.

13. The method of claim 1, wherein forming a gate further comprises depositing the silicon oxycarbide compound $SiO_{(2-2w)}C_w$ on the insulating layer using a Two Consecutive Decomposition and Deposition Chamber (TCDDC) system.

14. The method of claim 1, wherein forming a gate further comprises:
   depositing the silicon oxycarbide compound $SiO_{(2-2w)}C_w$ to form a layer of gate material on the insulating layer; and
   conductively doping the silicon oxycarbide compound $SiO_{(2-2w)}C_w$ while depositing the silicon oxycarbide compound $SiO_{(2-2w)}C_w$ on the insulating layer.

15. The method of claim 1, further comprising oxidizing the gate to form a thin layer of oxide on the gate.

16. The method of claim 1, wherein the gate is a floating gate, and further comprising:
   forming a second insulating layer on the floating gate; and
   forming a control gate on the second insulating layer.

17. The method of claim 1 wherein:
   forming a source region comprises forming an n-type source region and an n-type drain region in a p-type silicon substrate, a channel region being between the n-type source region and the n-type drain region in the silicon substrate;
   forming an insulating layer comprises forming a layer of gate oxide or a layer of tunnel oxide on the channel region by dry thermal oxidation;
   forming a gate further comprises:
      depositing a film of a polycrystalline or microcrystalline doped silicon oxycarbide compound $SiO_{(2-2w)}C_w$ on the insulating layer;
      depositing the silicon oxycarbide compound $SiO_{(2-2w)}C_w$ on the insulating layer by a Two Consecutive Decomposition and Deposition Chamber (TCDDC) system, or by low pressure chemical vapor deposition, or by low pressure rapid thermal chemical vapor deposition;
      doping the silicon oxycarbide compound $SiO_{(2-2w)}C_w$ with an n-type dopant or boron while forming the gate or by a subsequent ion implantation; and
   further comprising:
      forming a well region in the semiconductor substrate;
      forming field oxide on the semiconductor substrate to define an active region;
      oxidizing the gate by plasma oxidation to form a layer of oxide on the gate; and
      depositing oxide over the gate, the source region, and the drain region by chemical vapor deposition.

18. The method of claim 1 wherein forming a source region comprises forming a p-type source region and a p-type drain region in an n-type silicon substrate, a channel region being between the p-type source region and the p-type drain region in the silicon substrate.

19. A method of fabricating a transistor comprising:

forming an insulating layer on a substrate;

forming a layer of a silicon oxycarbide compound $SiO_{(2-2w)}C_w$ on the insulating layer; and removing portions of the insulating layer and the layer of the silicon oxycarbide compound $SiO_{(2-2w)}C_w$ to form a gate on the substrate.

20. The method of claim 19, further comprising:

selecting w to establish an approximate barrier energy between the layer of the silicon oxycarbide compound $SiO_{(2-2w)}C_w$ and the insulating layer;

forming a well region in the substrate;

forming field oxide on the substrate to define an active region;

doping the silicon oxycarbide compound $SiO_{(2-2w)}C_w$ with an n-type dopant or boron while forming the layer of the silicon oxycarbide compound $SiO_{(2-2w)}C_w$ on the insulating layer or by a subsequent ion implantation; and wherein forming an insulating layer comprises forming a layer of gate oxide or a layer of tunnel oxide on a silicon substrate by dry thermal oxidation;

wherein forming a layer of a silicon oxycarbide compound $SiO_{(2-2w)}C_w$ comprises depositing a film of a polycrystalline or microcrystalline doped silicon oxycarbide compound $SiO_{(2-2w)}C_w$ on the insulating layer;

wherein forming a layer of a silicon oxycarbide compound $SiO_{(2-2w)}C_w$ further comprises depositing the silicon oxycarbide compound $SiO_{(2-2w)}C_w$ on the insulating layer by a Two Consecutive Decomposition and Deposition Chamber (TCDDC) system, or by low pressure chemical vapor deposition, or by low pressure rapid thermal chemical vapor deposition; and wherein removing comprises:
  patterning the layer of the silicon oxycarbide compound $SiO_{(2-2w)}C_w$ and
  etching the layer of the silicon oxycarbide compound $SiO_{(2-2w)}C_w$ and the insulating layer to form a gate by plasma etching, or reactive ion etching, or magnetron enhanced reactive ion etching, or a combination of plasma etching, reactive ion etching, and magnetron enhanced reactive ion etching.

21. The method of claim 19 wherein:

forming an insulating layer comprises forming an insulating layer on an n-type silicon substrate; and further comprising:
  forming a p-type source region and a p-type drain region separated by a channel region in the substrate;
  oxidizing the gate by plasma oxidation to form a layer of oxide on the gate; and
  depositing oxide over the gate, the source region, and the drain region by chemical vapor deposition.

22. The method of claim 19 wherein:

forming an insulating layer comprises forming an insulating layer on a p-type silicon substrate; and further comprising:
  forming an n-type source region and an n-type drain region separated by a channel region in the substrate;
  oxidizing the gate by plasma oxidation to form an intergate dielectric on the gate; and
  forming a polysilicon control gate over the intergate dielectric.

23. A method of fabricating a transistor comprising:

forming an insulating layer on a substrate;

forming a layer of a silicon oxycarbide compound $SiO_{(2-2w)}C_w$ on the insulating layer;

doping the silicon oxycarbide compound $SiO_{(2-2w)}C_w$ with a p-type dopant while forming the layer of the silicon oxycarbide compound $SiO_{(2-2w)}C_w$ on the insulating layer or by a subsequent ion implantation; and removing portions of the insulating layer and the layer of the silicon oxycarbide compound $SiO_{(2-2w)}C_w$ to form a gate on the substrate.

24. The method of claim 23, further comprising:

selecting w to establish an approximate barrier energy between the layer of the silicon oxycarbide compound $SiO_{(2-2w)}C_w$ and the insulating layer;

forming a well region in the substrate;

forming field oxide on the substrate to define an active region; and wherein doping the silicon oxycarbide compound $SiO_{(2-2w)}C_w$ further comprises doping the silicon oxycarbide compound $SiO_{(2-2w)}C_w$ with boron;

wherein forming an insulating layer comprises forming a layer of gate oxide or a layer of tunnel oxide on a silicon substrate by dry thermal oxidation;

wherein forming a layer of a silicon oxycarbide compound $SiO_{(2-2w)}C_w$ comprises depositing a film of a polycrystalline or microcrystalline doped silicon oxycarbide compound $SiO_{(2-2w)}C_w$ on the insulating layer;

wherein forming a layer of a silicon oxycarbide compound $SiO_{(2-2w)}C_w$ further comprises depositing the silicon oxycarbide compound $SiO_{(2-2w)}C_w$ on the insulating layer by a Two Consecutive Decomposition and Deposition Chamber (TCDDC) system, or by low pressure chemical vapor deposition, or by low pressure rapid thermal chemical vapor deposition; and wherein removing comprises:
  patterning the layer of the silicon oxycarbide compound $SiO_{(2-2w)}C_w$ and
  etching the layer of the silicon oxycarbide compound $SiO_{(2-2w)}C_w$ and the insulating layer to form a gate by plasma etching, or reactive ion etching, or magnetron enhanced reactive ion etching, or a combination of plasma etching, reactive ion etching, and magnetron enhanced reactive ion etching.

25. The method of claim 23 wherein:

forming an insulating layer comprises forming an insulating layer on an n-type silicon substrate; and further comprising:
  forming a p-type source region and a p-type drain region separated by a channel region in the substrate;
  oxidizing the gate by plasma oxidation to form a layer of oxide on the gate; and
  depositing oxide over the gate, the source region, and the drain region by chemical vapor deposition.

26. The method of claim 23 wherein:

forming an insulating layer comprises forming an insulating layer on a p-type silicon substrate; and further comprising:
  forming an n-type source region and an n-type drain region separated by a channel region in the substrate;
  oxidizing the gate by plasma oxidation to form an intergate dielectric on the gate; and
  forming a polysilicon control gate over the intergate dielectric.

27. A method of fabricating a transistor comprising:

forming an insulating layer on a substrate;

forming a layer of a silicon oxycarbide compound $SiO_{(2-2w)}C_w$ on the insulating layer;

doping the silicon oxycarbide compound $SiO_{(2-2w)}C_w$ with an n-type dopant while forming the layer of the silicon oxycarbide compound $SiO_{(2-2w)}C_w$ on the insulating layer or by a subsequent ion implantation; and removing portions of the insulating layer and the layer of the silicon oxycarbide compound $SiO_{(2-2w)}C_w$ to form a gate on the substrate.

28. The method of claim 27, further comprising:

selecting w to establish an approximate barrier energy between the layer of the silicon oxycarbide compound $SiO_{(2-2w)}C_w$ and the insulating layer;

forming a well region in the substrate;

forming field oxide on the substrate to define an active region; and wherein forming an insulating layer comprises forming a layer of gate oxide or a layer of tunnel oxide on a silicon substrate by dry thermal oxidation;

wherein forming a layer of a silicon oxycarbide compound $SiO_{(2-2w)}C_w$ comprises depositing a film of a polycrystalline or microcrystalline doped silicon oxycarbide compound $SiO_{(2-2w)}C_w$ on the insulating layer;

wherein forming a layer of a silicon oxycarbide compound $SiO_{(2-2w)}C_w$ further comprises depositing the silicon oxycarbide compound $SiO_{(2-2w)}C_w$ on the insulating layer by a Two Consecutive Decomposition and Deposition Chamber (TCDDC) system, or by low pressure chemical vapor deposition, or by low pressure rapid thermal chemical vapor deposition; and wherein removing comprises:

patterning the layer of the silicon oxycarbide compound $SiO_{(2-2w)}C_w$; and etching the layer of the silicon oxycarbide compound $SiO_{(2-2w)}C_w$ and the insulating layer to form a gate by plasma etching, or reactive ion etching, or magnetron enhanced reactive ion etching, or a combination of plasma etching, reactive ion etching, and magnetron enhanced reactive ion etching.

29. The method of claim 27 wherein:

forming an insulating layer comprises forming an insulating layer on an n-type silicon substrate; and further comprising:

forming a p-type source region and a p-type drain region separated by a channel region in the substrate;

oxidizing the gate by plasma oxidation to form a layer of oxide on the gate; and depositing oxide over the gate, the source region, and the drain region by chemical vapor deposition.

30. The method of claim 27 wherein:

forming an insulating layer comprises forming an insulating layer on a p-type silicon substrate; and further comprising:

forming an n-type source region and an n-type drain region separated by a channel region in the substrate;

oxidizing the gate by plasma oxidation to form an intergate dielectric on the gate; and forming a polysilicon control gate over the intergate dielectric.

31. A method of fabricating a transistor comprising:

forming an insulating layer on a substrate;

forming a layer of a silicon oxycarbide compound $SiO_{(2-2w)}C_w$ on the insulating layer;

doping the silicon oxycarbide compound $SiO_{(2-2w)}C_w$ with boron while forming the layer of the silicon oxycarbide compound $SiO_{(2-2w)}C_w$ on the insulating layer or by a subsequent ion implantation; and removing portions of the insulating layer and the layer of the silicon oxycarbide compound $SiO_{(2-2w)}C_w$ to form a gate on the substrate.

32. The method of claim 31, further comprising:

selecting w to establish an approximate barrier energy between the layer of the silicon oxycarbide compound $SiO_{(2-2w)}C_w$ and the insulating layer;

forming a well region in the substrate;

forming field oxide on the substrate to define an active region; and wherein forming an insulating layer comprises forming a layer of gate oxide or a layer of tunnel oxide on a silicon substrate by dry thermal oxidation;

wherein forming a layer of a silicon oxycarbide compound $SiO_{(2-2w)}C_w$ comprises depositing a film of a polycrystalline or microcrystalline doped silicon oxycarbide compound $SiO_{(2-2w)}C_w$ on the insulating layer;

wherein forming a layer of a silicon oxycarbide compound $SiO_{(2-2w)}C_w$ further comprises depositing the silicon oxycarbide compound $SiO_{(2-2w)}C_w$ on the insulating layer by a Two Consecutive Decomposition and Deposition Chamber (TCDDC) system, or by low pressure chemical vapor deposition, or by low pressure rapid thermal chemical vapor deposition; and wherein removing comprises:

patterning the layer of the silicon oxycarbide compound $SiO_{(2-2w)}C_w$; and etching the layer of the silicon oxycarbide compound $SiO_{(2-2w)}C_w$ and the insulating layer to form a gate by plasma etching, or reactive ion etching, or magnetron enhanced reactive ion etching, or a combination of plasma etching, reactive ion etching, and magnetron enhanced reactive ion etching.

33. The method of claim 31 wherein:

forming an insulating layer comprises forming an insulating layer on an n-type silicon substrate; and further comprising:

forming a p-type source region and a p-type drain region separated by a channel region in the substrate;

oxidizing the gate by plasma oxidation to form a layer of oxide on the gate; and depositing oxide over the gate, the source region, and the drain region by chemical vapor deposition.

34. The method of claim 31 wherein:

forming an insulating layer comprises forming an insulating layer on a p-type silicon substrate; and further comprising:

forming an n-type source region and an n-type drain region separated by a channel region in the substrate;

oxidizing the gate by plasma oxidation to form an intergate dielectric on the gate; and forming a polysilicon control gate over the intergate dielectric.

35. A method of fabricating a transistor comprising:

forming an insulating layer on a substrate;

forming a layer of a silicon oxycarbide compound $SiO_{(2-2w)}C_w$ on the insulating layer;

removing portions of the insulating layer and the layer of the silicon oxycarbide compound $SiO_{(2-2w)}C_w$ to form a floating gate on the substrate;

forming an intergate dielectric on the floating gate; and
forming a control gate over the intergate dielectric.

36. The method of claim 35, further comprising:
selecting w to establish an approximate barrier energy between the layer of the silicon oxycarbide compound $SiO_{(2-2w)}C_w$ and the insulating layer;
forming a well region in the substrate;
forming field oxide on the substrate to define an active region;
doping the silicon oxycarbide compound $SiO_{(2-2w)}C_w$ with an n-type dopant or boron while forming the layer of the silicon oxycarbide compound $SiO_{(2-2w)}C_w$ on the insulating layer or by a subsequent ion implantation; and
wherein forming an insulating layer comprises forming a layer of tunnel oxide on a silicon substrate by dry thermal oxidation;
wherein forming a layer of a silicon oxycarbide compound $SiO_{(2-2w)}C_w$ comprises depositing a film of a polycrystalline or microcrystalline doped silicon oxycarbide compound $SiO_{(2-2w)}C_w$ on the insulating layer;
wherein forming an intergate dielectric comprises oxidizing the floating gate by plasma oxidation to form an intergate dielectric on the floating gate;
wherein forming a control gate comprises forming a polysilicon control gate over the intergate dielectric;
wherein forming a layer of a silicon oxycarbide compound $SiO_{(2-2w)}C_w$ further comprises depositing the silicon oxycarbide compound $SiO_{(2-2w)}C_w$ on the insulating layer by a Two Consecutive Decomposition and Deposition Chamber (TCDDC) system, or by low pressure chemical vapor deposition, or by low pressure rapid thermal chemical vapor deposition; and
wherein removing comprises:
patterning the layer of the silicon oxycarbide compound $SiO_{(2-2w)}C_w$; and
etching the layer of the silicon oxycarbide compound $SiO_{(2-2w)}C_w$ and the insulating layer to form a floating gate by plasma etching, or reactive ion etching, or magnetron enhanced reactive ion etching, or a combination of plasma etching, reactive ion etching, and magnetron enhanced reactive ion etching.

37. The method of claim 35 wherein:
forming an insulating layer comprises forming an insulating layer on an n-type silicon substrate; and
further comprising forming a p-type source region and a p-type drain region separated by a channel region in the substrate.

38. The method of claim 35 wherein:
forming an insulating layer comprises forming an insulating layer on a p-type silicon substrate; and
further comprising forming an n-type source region and an n-type drain region separated by a channel region in the substrate.

39. A method of fabricating a transistor comprising:
forming an insulating layer on a substrate;
forming a layer of a silicon oxycarbide compound $SiO_{(2-2w)}C_w$ on the insulating layer;
doping the silicon oxycarbide compound $SiO_{(2-2w)}C_w$ with an n-type dopant while forming the layer of the silicon oxycarbide compound $SiO_{(2-2w)}C_w$ on the insulating layer or by a subsequent ion implantation;
removing portions of the insulating layer and the layer of the silicon oxycarbide compound $SiO_{(2-2w)}C_w$ to form a floating gate on the substrate;
forming an intergate dielectric on the floating gate; and
forming a control gate over the intergate dielectric.

40. The method of claim 39, further comprising:
selecting w to establish an approximate barrier energy between the layer of the silicon oxycarbide compound $SiO_{(2-2w)}C_w$ and the insulating layer;
forming a well region in the substrate;
forming field oxide on the substrate to define an active region; and
wherein forming an insulating layer comprises forming a layer of tunnel oxide on a silicon substrate by dry thermal oxidation;
wherein forming a layer of a silicon oxycarbide compound $SiO_{(2-2w)}C_w$ comprises depositing a film of a polycrystalline or microcrystalline doped silicon oxycarbide compound $SiO_{(2-2w)}C_w$ on the insulating layer;
wherein forming an intergate dielectric comprises oxidizing the floating gate by plasma oxidation to form an intergate dielectric on the floating gate;
wherein forming a control gate comprises forming a polysilicon control gate over the intergate dielectric;
wherein forming a layer of a silicon oxycarbide compound $SiO_{(2-2w)}C_w$ further comprises depositing the silicon oxycarbide compound $SiO_{(2-2w)}C_w$ on the insulating layer by a Two Consecutive Decomposition and Deposition Chamber (TCDDC) system, or by low pressure chemical vapor deposition, or by low pressure rapid thermal chemical vapor deposition; and
wherein removing comprises:
patterning the layer of the silicon oxycarbide compound $SiO_{(2-2w)}C_w$; and
etching the layer of the silicon oxycarbide compound $SiO_{(2-2w)}C_w$ and the insulating layer to form a floating gate by plasma etching, or reactive ion etching, or magnetron enhanced reactive ion etching, or a combination of plasma etching, reactive ion etching, and magnetron enhanced reactive ion etching.

41. The method of claim 39 wherein:
forming an insulating layer comprises forming an insulating layer on an n-type silicon substrate; and
further comprising forming a p-type source region and a p-type drain region separated by a channel region in the substrate.

42. The method of claim 39 wherein:
forming an insulating layer comprises forming an insulating layer on a p-type silicon substrate; and
further comprising forming an n-type source region and an n-type drain region separated by a channel region in the substrate.

43. A method of fabricating a transistor comprising:
forming an insulating layer on a substrate;
forming a layer of a silicon oxycarbide compound $SiO_{(2-2w)}C_w$ on the insulating layer;
doping the silicon oxycarbide compound $SiO_{(2-2w)}C_w$ with a p-type dopant while forming the layer of the silicon oxycarbide compound $SiO_{(2-2w)}C_w$ on the insulating layer or by a subsequent ion implantation;
removing portions of the insulating layer and the layer of the silicon oxycarbide compound $SiO_{(2-2w)}C_w$ to form a floating gate on the substrate;
forming an intergate dielectric on the floating gate; and
forming a control gate over the intergate dielectric.

44. The method of claim 43, further comprising:

selecting w to establish an approximate barrier energy between the layer of the silicon oxycarbide compound $SiO_{(2-2w)}C_w$ and the insulating layer;

forming a well region in the substrate;

forming field oxide on the substrate to define an active region; and wherein doping the silicon oxycarbide compound $SiO_{(2-2w)}C_w$ further comprises doping the silicon oxycarbide compound $SiO_{(2-2w)}C_w$ with boron;

wherein forming an insulating layer comprises forming a layer of tunnel oxide on a silicon substrate by dry thermal oxidation;

wherein forming a layer of a silicon oxycarbide compound $SiO_{(2-2w)}C_w$ comprises depositing a film of a polycrystalline or microcrystalline doped silicon oxycarbide compound $SiO_{(2-2w)}C_w$ on the insulating layer;

wherein forming an intergate dielectric comprises oxidizing the floating gate by plasma oxidation to form an intergate dielectric on the floating gate;

wherein forming a control gate comprises forming a polysilicon control gate over the intergate dielectric;

wherein forming a layer of a silicon oxycarbide compound $SiO_{(2-2w)}C_w$ further comprises depositing the silicon oxycarbide compound $SiO_{(2-2w)}C_w$ on the insulating layer by a Two Consecutive Decomposition and Deposition Chamber (TCDDC) system, or by low pressure chemical vapor deposition, or by low pressure rapid thermal chemical vapor deposition; and wherein removing comprises:
  patterning the layer of the silicon oxycarbide compound $SiO_{(2-2w)}C_w$; and
  etching the layer of the silicon oxycarbide compound $SiO_{(2-2w)}C_w$ and the insulating layer to form a floating gate by plasma etching, or reactive ion etching, or magnetron enhanced reactive ion etching, or a combination of plasma etching, reactive ion etching, and magnetron enhanced reactive ion etching.

45. The method of claim 43 wherein:

forming an insulating layer comprises forming an insulating layer on an n-type silicon substrate; and further comprising forming a p-type source region and a p-type drain region separated by a channel region in the substrate.

46. The method of claim 43 wherein:

forming an insulating layer comprises forming an insulating layer on a p-type silicon substrate; and further comprising forming an n-type source region and an n-type drain region separated by a channel region in the substrate.

47. A method of fabricating a transistor comprising:

forming an insulating layer on a substrate;

forming a layer of a silicon oxycarbide compound $SiO_{(2-2w)}C_w$ on the insulating layer;

doping the silicon oxycarbide compound $SiO_{(2-2w)}C_w$ with boron while forming the layer of the silicon oxycarbide compound $SiO_{(2-2w)}C_w$ on the insulating layer or by a subsequent ion implantation;

removing portions of the insulating layer and the layer of the silicon oxycarbide compound $SiO_{(2-2w)}C_w$ to form a floating gate on the substrate;

forming an intergate dielectric on the floating gate; and forming a control gate over the intergate dielectric.

48. The method of claim 47, further comprising:

selecting w to establish an approximate barrier energy between the layer of the silicon oxycarbide compound $SiO_{(2-2w)}C_w$ and the insulating layer;

forming a well region in the substrate;

forming field oxide on the substrate to define an active region; and wherein forming an insulating layer comprises forming a layer of tunnel oxide on a silicon substrate by dry thermal oxidation;

wherein forming a layer of a silicon oxycarbide compound $SiO_{(2-2w)}C_w$ comprises depositing a film of a polycrystalline or microcrystalline doped silicon oxycarbide compound $SiO_{(2-2w)}C_w$ on the insulating layer;

wherein forming an intergate dielectric comprises oxidizing the floating gate by plasma oxidation to form an intergate dielectric on the floating gate;

wherein forming a control gate comprises forming a polysilicon control gate over the intergate dielectric;

wherein forming a layer of a silicon oxycarbide compound $SiO_{(2-2w)}C_w$ further comprises depositing the silicon oxycarbide compound $SiO_{(2-2w)}C_w$ on the insulating layer by a Two Consecutive Decomposition and Deposition Chamber (TCDDC) system, or by low pressure chemical vapor deposition, or by low pressure rapid thermal chemical vapor deposition; and wherein removing comprises:
  patterning the layer of the silicon oxycarbide compound $SiO_{(2-2w)}C_w$; and
  etching the layer of the silicon oxycarbide compound $SiO_{(2-2w)}C_w$ and the insulating layer to form a floating gate by plasma etching, or reactive ion etching, or magnetron enhanced reactive ion etching, or a combination of plasma etching, reactive ion etching, and magnetron enhanced reactive ion etching.

49. The method of claim 47 wherein:

forming an insulating layer comprises forming an insulating layer on an n-type silicon substrate; and farther comprising forming a p-type source region and a p-type drain region separated by a channel region in the substrate.

50. The method of claim 47 wherein:

forming an insulating layer comprises forming an insulating layer on a p-type silicon substrate; and further comprising forming an n-type source region and an n-type drain region separated by a channel region in the substrate.

51. A method of fabricating a memory cell comprising:

forming an insulating layer on a substrate;

forming a layer of a silicon oxycarbide compound $SiO_{(2-2w)}C_w$ on the insulating layer;

removing portions of the insulating layer and the layer of the silicon oxycarbide compound $SiO_{(2-2w)}C_w$ to form a floating gate on the substrate;

forming an intergate dielectric on the floating gate; and forming a control gate over the intergate dielectric.

52. The method of claim 51, further comprising:

selecting w to establish an approximate barrier energy between the layer of the silicon oxycarbide compound $SiO_{(2-2w)}C_w$ and the insulating layer;

forming a well region in the substrate;

forming field oxide on the substrate to define an active region;

doping the silicon oxycarbide compound $SiO_{(2-2w)}C_w$ with an n-type dopant or boron while forming the layer of the silicon oxycarbide compound $SiO_{(2-2w)}C_w$ on the insulating layer or by a subsequent ion implantation; and wherein forming an insulating layer comprises forming a layer of tunnel oxide on a silicon substrate by dry thermal oxidation;

wherein forming a layer of a silicon oxycarbide compound $SiO_{(2-2w)}C_w$ comprises depositing a film of a polycrystalline or microcrystalline doped silicon oxycarbide compound $SiO_{(2-2w)}C_w$ on the insulating layer;

wherein forming an intergate dielectric comprises oxidizing the floating gate by plasma oxidation to form an intergate dielectric on the floating gate;

wherein forming a control gate comprises forming a polysilicon control gate over the intergate dielectric;

wherein forming a layer of a silicon oxycarbide compound $SiO_{(2-2w)}C_w$ further comprises depositing the silicon oxycarbide compound $SiO_{(2-2w)}C_w$ on the insulating layer by a Two Consecutive Decomposition and Deposition Chamber (TCDDC) system, or by low pressure chemical vapor deposition, or by low pressure rapid thermal chemical vapor deposition; and wherein removing comprises:
    patterning the layer of the silicon oxycarbide compound $SiO_{(2-2w)}C_w$; and
    etching the layer of the silicon oxycarbide compound $SiO_{(2-2w)}C_w$ and the insulating layer to form a floating gate by plasma etching, or reactive ion etching, or magnetron enhanced reactive ion etching, or a combination of plasma etching, reactive ion etching, and magnetron enhanced reactive ion etching.

53. The method of claim 51 wherein:
forming an insulating layer comprises forming an insulating layer on an n-type silicon substrate; and
further comprising forming a p-type source region and a p-type drain region separated by a channel region in the substrate.

54. The method of claim 51 wherein:
forming an insulating layer comprises forming an insulating layer on a p-type silicon substrate; and
further comprising forming an n-type source region and an n-type drain region separated by a channel region in the substrate.

55. A method of fabricating a memory cell comprising:
forming an insulating layer on a substrate;
forming a layer of a silicon oxycarbide compound $SiO_{(2-2w)}C_w$ on the insulating layer;
doping the silicon oxycarbide compound $SiO_{(2-2w)}C_w$ with a p-type dopant while forming the layer of the silicon oxycarbide compound $SiO_{(2-2w)}C_w$ on the insulating layer or by a subsequent ion implantation; and
removing portions of the insulating layer and the layer of the silicon oxycarbide compound $SiO_{(2-2w)}C_w$ to form a floating gate on the substrate;
forming an intergate dielectric on the floating gate; and
forming a control gate over the intergate dielectric.

56. The method of claim 55, further comprising:
selecting w to establish an approximate barrier energy between the layer of the silicon oxycarbide compound $SiO_{(2-2w)}C_w$ and the insulating layer;
forming a well region in the substrate;
forming field oxide on the substrate to define an active region; and wherein doping the silicon oxycarbide compound $SiO_{(2-2w)}C_w$ further comprises doping the silicon oxycarbide compound $SiO_{(2-2w)}C_w$ with boron;

wherein forming an insulating layer comprises forming a layer of tunnel oxide on a silicon substrate by dry thermal oxidation;

wherein forming a layer of a silicon oxycarbide compound $SiO_{(2-2w)}C_w$ comprises depositing a film of a polycrystalline or microcrystalline doped silicon oxycarbide compound $SiO_{(2-2w)}C_w$ on the insulating layer;

wherein forming an intergate dielectric comprises oxidizing the floating gate by plasma oxidation to form an intergate dielectric on the floating gate;

wherein forming a control gate comprises forming a polysilicon control gate over the intergate dielectric;

wherein forming a layer of a silicon oxycarbide compound $SiO_{(2-2w)}C_w$ further comprises depositing the silicon oxycarbide compound $SiO_{(2-2w)}C_w$ on the insulating layer by a Two Consecutive Decomposition and Deposition Chamber (TCDDC) system, or by low pressure chemical vapor deposition, or by low pressure rapid thermal chemical vapor deposition; and wherein removing comprises:
    patterning the layer of the silicon oxycarbide compound $SiO_{(2-2w)}C_w$; and
    etching the layer of the silicon oxycarbide compound $SiO_{(2-2w)}C_w$ and the insulating layer to form a floating gate by plasma etching, or reactive ion etching, or magnetron enhanced reactive ion etching, or a combination of plasma etching, reactive ion etching, and magnetron enhanced reactive ion etching.

57. The method of claim 55 wherein:
forming an insulating layer comprises forming an insulating layer on an n-type silicon substrate; and
further comprising forming a p-type source region and a p-type drain region separated by a channel region in the substrate.

58. The method of claim 55 wherein:
forming an insulating layer comprises forming an insulating layer on a p-type silicon substrate; and
further comprising forming an n-type source region and an n-type drain region separated by a channel region in the substrate.

59. A method of fabricating a memory cell comprising:
forming an insulating layer on a substrate;
forming a layer of a silicon oxycarbide compound $SiO_{(2-2w)}C_w$ on the insulating layer;
doping the silicon oxycarbide compound $SiO_{(2-2w)}C_w$ with boron while forming the layer of the silicon oxycarbide compound $SiO_{(2-2w)}C_w$ on the insulating layer or by a subsequent ion implantation; and
removing portions of the insulating layer and the layer of the silicon oxycarbide compound $SiO_{(2-2w)}C_w$ to form a floating gate on the substrate;
forming an intergate dielectric on the floating gate; and
forming a control gate over the intergate dielectric.

60. The method of claim 59, further comprising:
selecting w to establish an approximate barrier energy between the layer of the silicon oxycarbide compound $SiO_{(2-2w)}C_w$ and the insulating layer;
forming a well region in the substrate;
forming field oxide on the substrate to define an active region; and
wherein forming an insulating layer comprises forming a layer of tunnel oxide on a silicon substrate by dry thermal oxidation;

wherein forming a layer of a silicon oxycarbide compound $SiO_{(2-2w)}C_w$ comprises depositing a film of a polycrystalline or microcrystalline doped silicon oxycarbide compound $SiO_{(2-2w)}C_w$ on the insulating layer;

wherein forming an intergate dielectric comprises oxidizing the floating gate by plasma oxidation to form an intergate dielectric on the floating gate;

wherein forming a control gate comprises forming a polysilicon control gate over the intergate dielectric;

wherein forming a layer of a silicon oxycarbide compound $SiO_{(2-2w)}C_w$ further comprises depositing the silicon oxycarbide compound $SiO_{(2-2w)}C_w$ on the insulating layer by a Two Consecutive Decomposition and Deposition Chamber (TCDDC) system, or by low pressure chemical vapor deposition, or by low pressure rapid thermal chemical vapor deposition; and wherein removing comprises:
  patterning the layer of the silicon oxycarbide compound $SiO_{(2-2w)}C_w$; and
  etching the layer of the silicon oxycarbide compound $SiO_{(2-2w)}C_w$ and the insulating layer to form a floating gate by plasma etching, or reactive ion etching, or magnetron enhanced reactive ion etching, or a combination of plasma etching, reactive ion etching, and magnetron enhanced reactive ion etching.

61. The method of claim 59 wherein:

forming an insulating layer comprises forming an insulating layer on an n-type silicon substrate; and further comprising forming a p-type source region and a p-type drain region separated by a channel region in the substrate.

62. The method of claim 59 wherein:

forming an insulating layer comprises forming an insulating layer on a p-type silicon substrate; and further comprising forming an n-type source region and an n-type drain region separated by a channel region in the substrate.

* * * * *

UNITED STATES PATENT AND TRADEMARK OFFICE
CERTIFICATE OF CORRECTION

PATENT NO. : 6,309,907 B1
DATED : October 30, 2001
INVENTOR(S) : Forbes et al.

Page 1 of 1

It is certified that error appears in the above-identified patent and that said Letters Patent is hereby corrected as shown below:

Column 2,
Line 7, delete "loge" and insert -- large --, therefor.

Column 5,
Line 46, delete "to" and insert -- µc --, therefor.

Column 13,
Line 17, delete "electron" and insert -- electrons --, therefor.

Signed and Sealed this

Sixteenth Day of April, 2002

Attest:

*Attesting Officer*

JAMES E. ROGAN
*Director of the United States Patent and Trademark Office*